US010912195B2

(12) United States Patent
Wu et al.

(10) Patent No.: US 10,912,195 B2
(45) Date of Patent: Feb. 2, 2021

(54) MULTI-EMBEDDED RADIO FREQUENCY BOARD AND MOBILE DEVICE INCLUDING THE SAME

(71) Applicant: The Boeing Company, Chicago, IL (US)

(72) Inventors: Shihchang Wu, Rancho Palos Verdes, CA (US); Kyle A. Woolrich, El Segundo, CA (US); Jay Stuart Spence, Hermosa Beach, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/237,897

(22) Filed: Jan. 2, 2019

(65) Prior Publication Data

US 2020/0214131 A1    Jul. 2, 2020

(51) Int. Cl.
| | | |
|---|---|---|
| H05K 7/02 | (2006.01) | |
| H05K 1/14 | (2006.01) | |
| H01Q 1/28 | (2006.01) | |
| H01Q 15/02 | (2006.01) | |
| H05K 1/02 | (2006.01) | |
| H05K 1/11 | (2006.01) | |
| H04B 1/40 | (2015.01) | |

(52) U.S. Cl.
CPC ............. H05K 1/144 (2013.01); H01Q 1/28 (2013.01); H01Q 15/02 (2013.01); H05K 1/0203 (2013.01); H05K 1/0243 (2013.01); H05K 1/11 (2013.01); H05K 7/02 (2013.01); H05K 7/026 (2013.01); H04B 1/40 (2013.01); H05K 2201/042 (2013.01); H05K 2201/10098 (2013.01)

(58) Field of Classification Search
None
See application file for complete search history.

(56) References Cited

U.S. PATENT DOCUMENTS

| | | | | |
|---|---|---|---|---|
| 5,737,194 A * | 4/1998 | Hopkins | .............. | H05K 7/1461 361/728 |
| 6,997,720 B2 * | 2/2006 | Perret | .................... | H05K 1/147 439/67 |
| 7,348,842 B2 * | 3/2008 | Ichitsubo | ................ | H01L 23/66 257/E25.03 |
| 7,352,576 B2 * | 4/2008 | McClure | ................... | G06F 1/20 361/610 |

(Continued)

OTHER PUBLICATIONS

European Search Report dated May 18, 2020; EP Application No. 19211178.

*Primary Examiner* — Courtney L Smith
(74) *Attorney, Agent, or Firm* — Perman & Green LLP

(57) ABSTRACT

A multi-embedded radio frequency board includes a plurality of printed circuit boards stacked one on the others, at least one of the printed circuit boards of the plurality of printed circuit boards being configured so as to have a different processing function than another processing function of another printed circuit board of the plurality of printed circuit boards, and an interconnection join layer disposed between adjacent printed circuit boards of the plurality of printed circuit boards so as to physically and electrically couple the adjacent printed circuit boards to each other so as to form an integrated printed circuit board module having a predetermined radio frequency communication characteristic.

24 Claims, 11 Drawing Sheets

(56) References Cited

U.S. PATENT DOCUMENTS

| | | | |
|---|---|---|---|
| 8,000,096 B2* | 8/2011 | Nemoz | H05K 7/1452 |
| | | | 312/223.1 |
| 8,681,501 B2* | 3/2014 | Govindasamy | G06F 1/203 |
| | | | 174/16.3 |
| 9,003,648 B2 | 4/2015 | Holcomb | |
| 9,161,475 B2* | 10/2015 | Ng | G06F 1/20 |
| 9,698,130 B2 | 7/2017 | Weis et al. | |
| 2003/0060172 A1 | 3/2003 | Kuriyama et al. | |
| 2006/0049995 A1 | 3/2006 | Imaoka et al. | |
| 2008/0111226 A1 | 5/2008 | White et al. | |
| 2011/0019381 A1 | 1/2011 | Kawano et al. | |
| 2011/0188207 A1* | 8/2011 | Won | G06F 1/20 |
| | | | 361/709 |
| 2013/0062099 A1 | 3/2013 | Hunrath | |
| 2015/0189763 A1 | 7/2015 | Schrittwieser | |
| 2016/0324004 A1 | 11/2016 | Schwarz et al. | |

* cited by examiner

MULTI-EMBEDDED RADIO FREQUENCY BOARD AND MOBILE DEVICE INCLUDING THE SAME

BACKGROUND

1. Field

The exemplary embodiments generally relate to printed circuit boards and in particular to multi-embedded radio frequency boards and devices incorporating the same multi-embedded radio frequency boards.

2. Brief Description of Related Developments

Generally, to increase processing and other capabilities of printed circuit boards, surface mount components are coupled to both the front and back sides of the printed circuit boards. However, each printed circuit board has a finite size (e.g., surface area to which the surface mount components may be coupled). With respect to communications, such as through antenna arrays, phased array antennas may have a high element count such as when the antenna elements are spaced apart by a distance that is less than the wavelength of the frequency being transmitted or received (e.g., a sub-frequency or wavelength spacing). This close packed lattice of antenna elements forces the surface mount components to be highly integrated and are typically packaged as a radio frequency integrated circuit (RFIC), and the degree of signal processing is therefore performance limited to what can be packed on the surface mount parts within the finite surface area of the printed circuit board.

In other aspects, multiple circuit boards are coupled to each other using cables, such as between radio frequency modules and antenna arrays. The use of cables works well when the number of interconnects are low; however, where the number of interconnects are high (such as with high antenna element count phased arrays with sub-frequency spacing), the use of cable becomes impractical and increases the area needed to house the circuit boards.

SUMMARY

The following is a non-exhaustive list of examples, which may or may not be claimed, of the subject matter according to the present disclosure.

One example of the subject matter according to the present disclosure relates to a multi-embedded radio frequency board comprising: at least one radio frequency signal generating printed circuit board; at least one embedded radio frequency module printed circuit board communicably coupled to the at least one radio frequency signal generating printed circuit board; and at least one communication printed circuit board communicably coupled to one or more of the at least one radio frequency signal generating printed circuit board or the at least one embedded radio frequency module printed circuit board; wherein the at least one radio frequency signal generating printed circuit board, the at least one embedded radio frequency module printed circuit board, and the at least one communication printed circuit board are stacked one board on top of the others, and adjacent boards of the at least one radio frequency signal generating printed circuit board, the at least one embedded radio frequency module printed circuit board, and the at least one communication printed circuit board are coupled by a respective interconnection join layer so as to form an integrated printed circuit board module.

Another example of the subject matter according to the present disclosure relates to a multi-embedded radio frequency board comprising: a plurality of printed circuit boards stacked one on the others, at least one of the printed circuit boards of the plurality of printed circuit boards being configured so as to have a different processing function than another processing function of another printed circuit board of the plurality of printed circuit boards; and an interconnection join layer disposed between adjacent printed circuit boards of the plurality of printed circuit boards so as to physically and electrically couple the adjacent printed circuit boards to each other so as to form an integrated printed circuit board module having a predetermined radio frequency communication characteristic.

Still another example of the subject matter according to the present disclosure relates to a mobile device including a multi-embedded radio frequency board, comprising: a frame; and the multi-embedded radio frequency board being coupled to the frame, the multi-embedded radio frequency board including a plurality of printed circuit boards stacked one on the other, at least one of the printed circuit boards of the plurality of printed circuit boards being configured so as to have a different processing function than another processing function of another printed circuit board of the plurality of printed circuit boards; and an interconnection join layer disposed between adjacent printed circuit boards of the plurality of printed circuit boards so as to physically and electrically couple the adjacent printed circuit boards to each other so as to form an integrated printed circuit board module having a predetermined radio frequency communication characteristic.

Further still another example of the subject matter according to the present disclosure relates to a radio frequency signal repeater comprising: a first communication printed circuit board; a second communication printed circuit board; at least one embedded radio frequency module printed circuit board disposed between and communicably coupled to both the first communication printed circuit board and the second communication printed circuit board; and wherein the at least one embedded radio frequency module printed circuit board, the first communication printed circuit board, and the second communication printed circuit board are stacked one board on top of the others, and adjacent boards of the at least one embedded radio frequency module printed circuit board, the first communication printed circuit board, and the second communication printed circuit board are coupled by a respective interconnection join layer so as to form an integrated printed circuit board module.

Yet another example of the subject matter according to the present disclosure relates to a radio frequency signal lens comprising: a first communication printed circuit board; a second communication printed circuit board; at least one embedded radio frequency module printed circuit board disposed between and communicably coupled to both the first communication printed circuit board and the second communication printed circuit board; and wherein the at least one embedded radio frequency module printed circuit board, the first communication printed circuit board, and the second communication printed circuit board are stacked one board on top of the others, and adjacent boards of the at least one embedded radio frequency module printed circuit board, the first communication printed circuit board, and the second communication printed circuit board are coupled by a respective interconnection join layer so as to form an integrated printed circuit board module.

BRIEF DESCRIPTION OF THE DRAWINGS

Figure 1A:
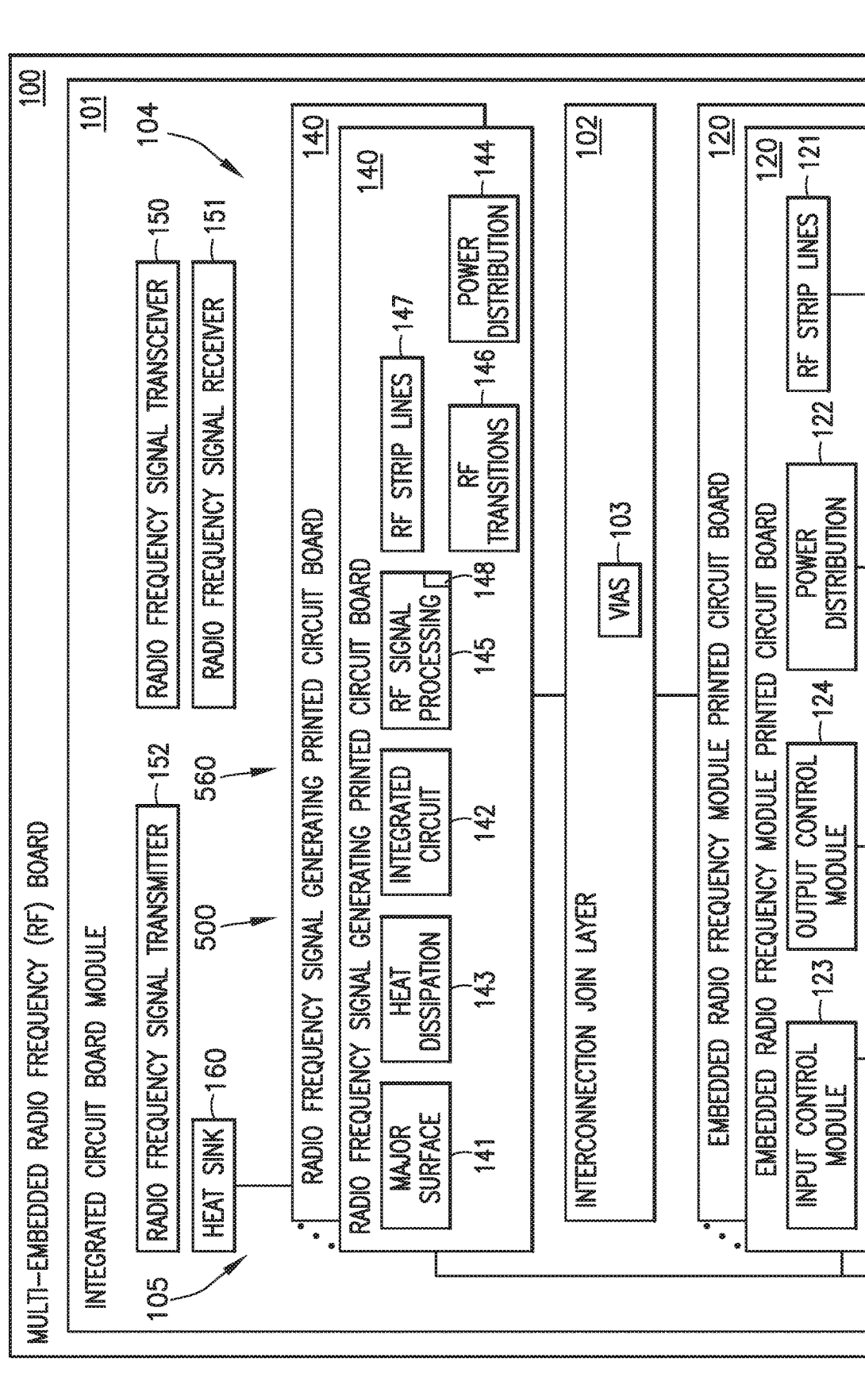
Figure 1B:
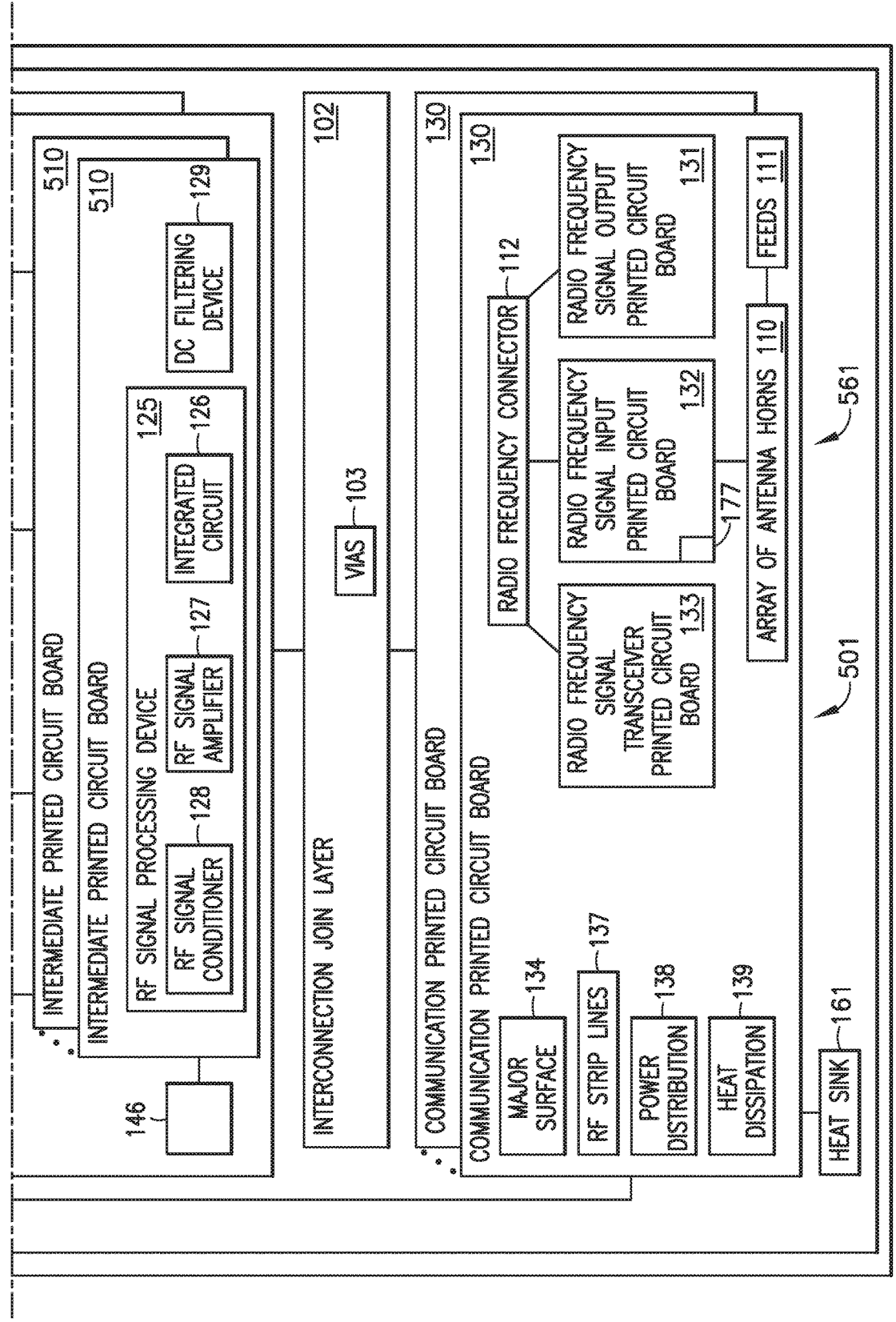
Figure 2:
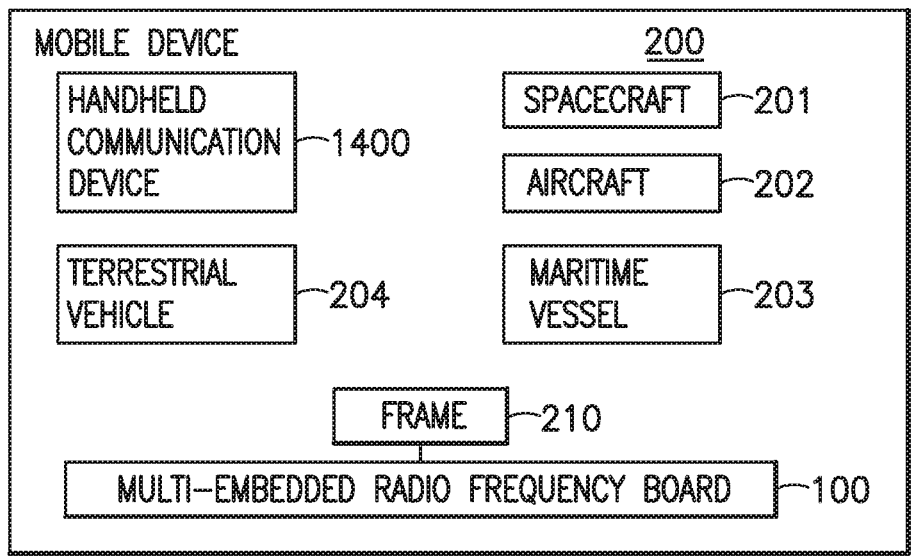
Figure 3:
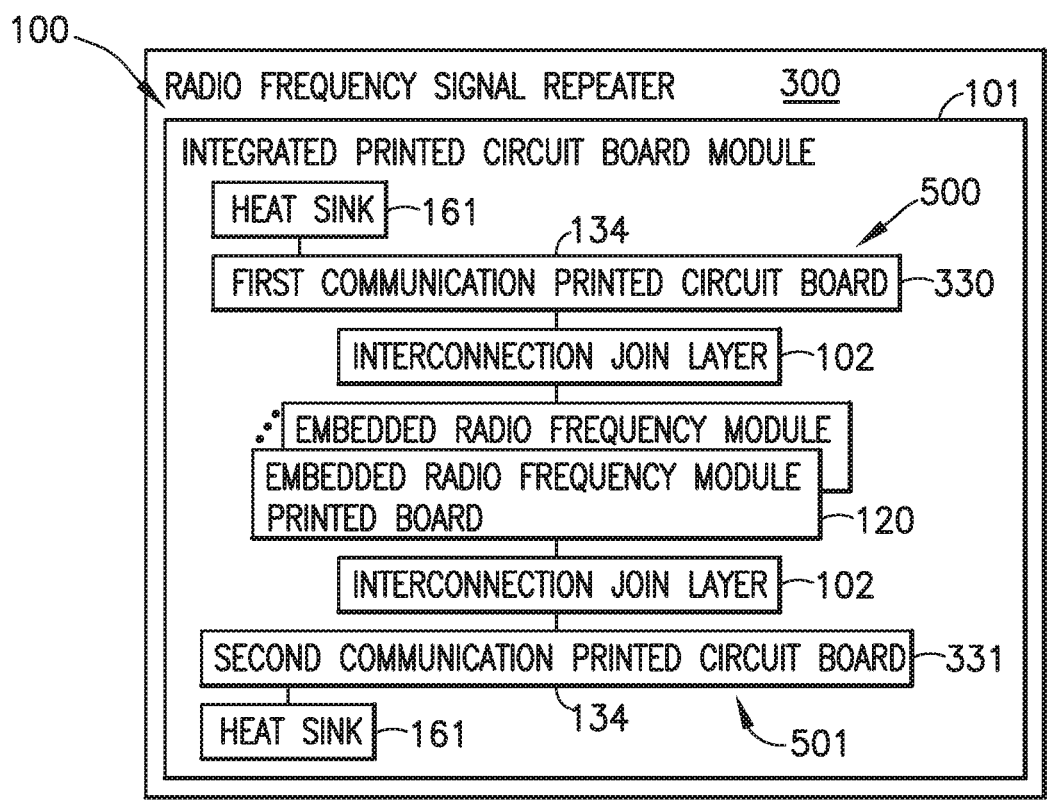
Figure 4:
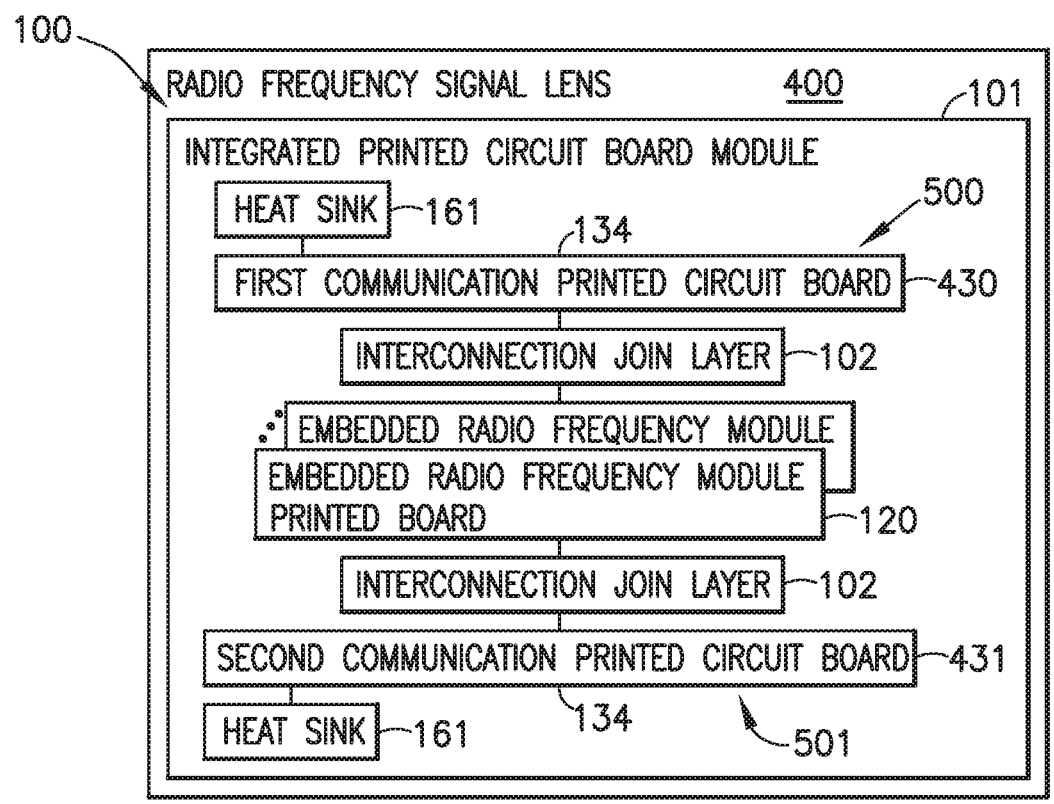
Figure 5:
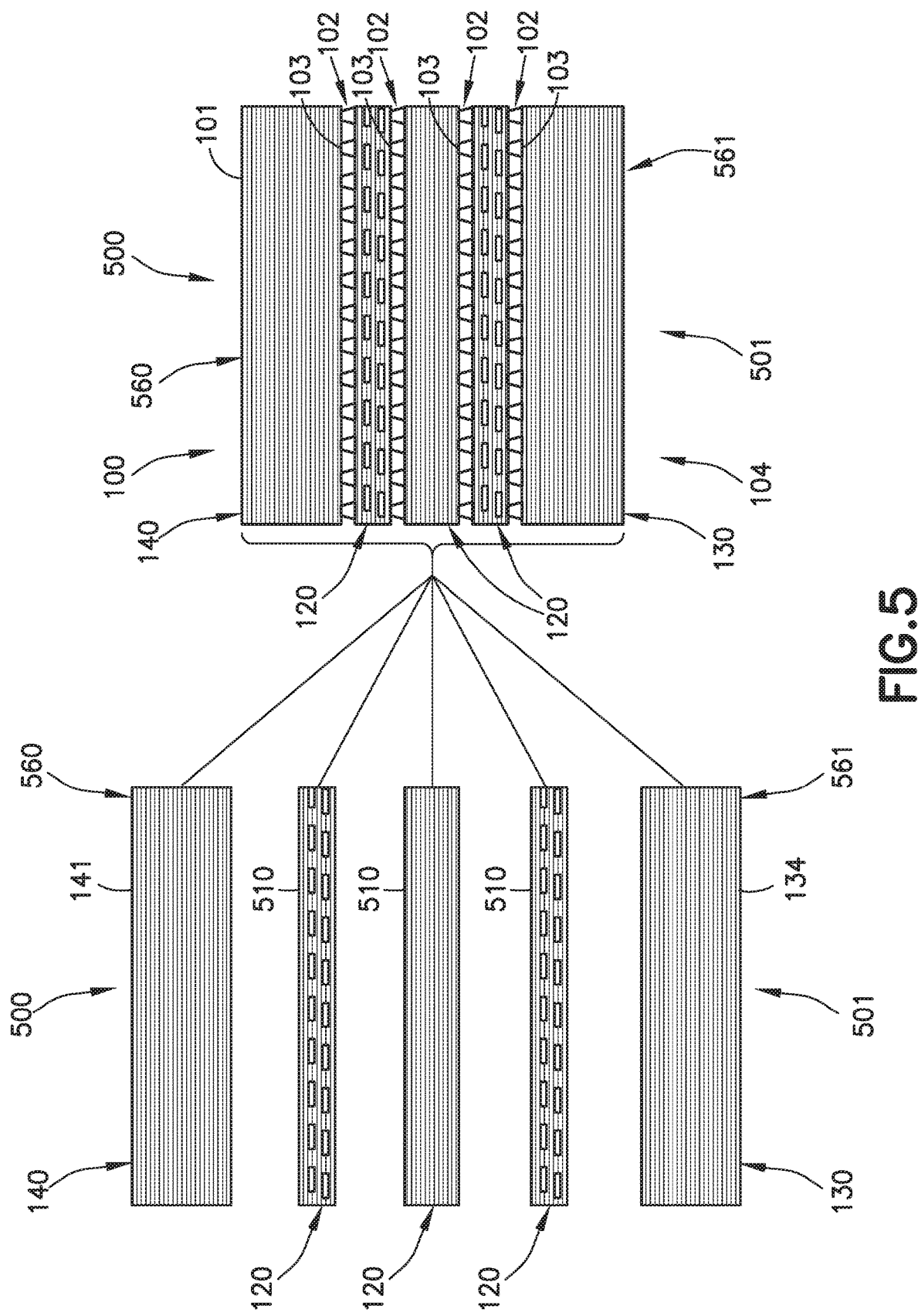
Figure 6:
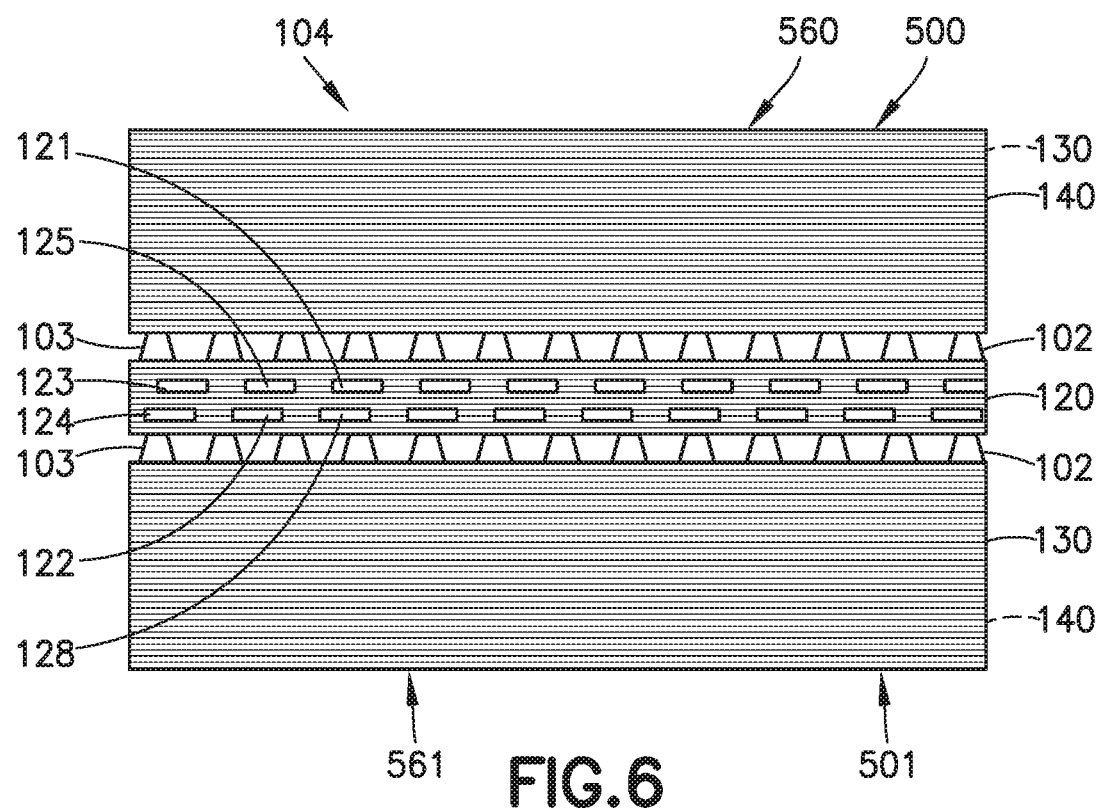
Figure 7:
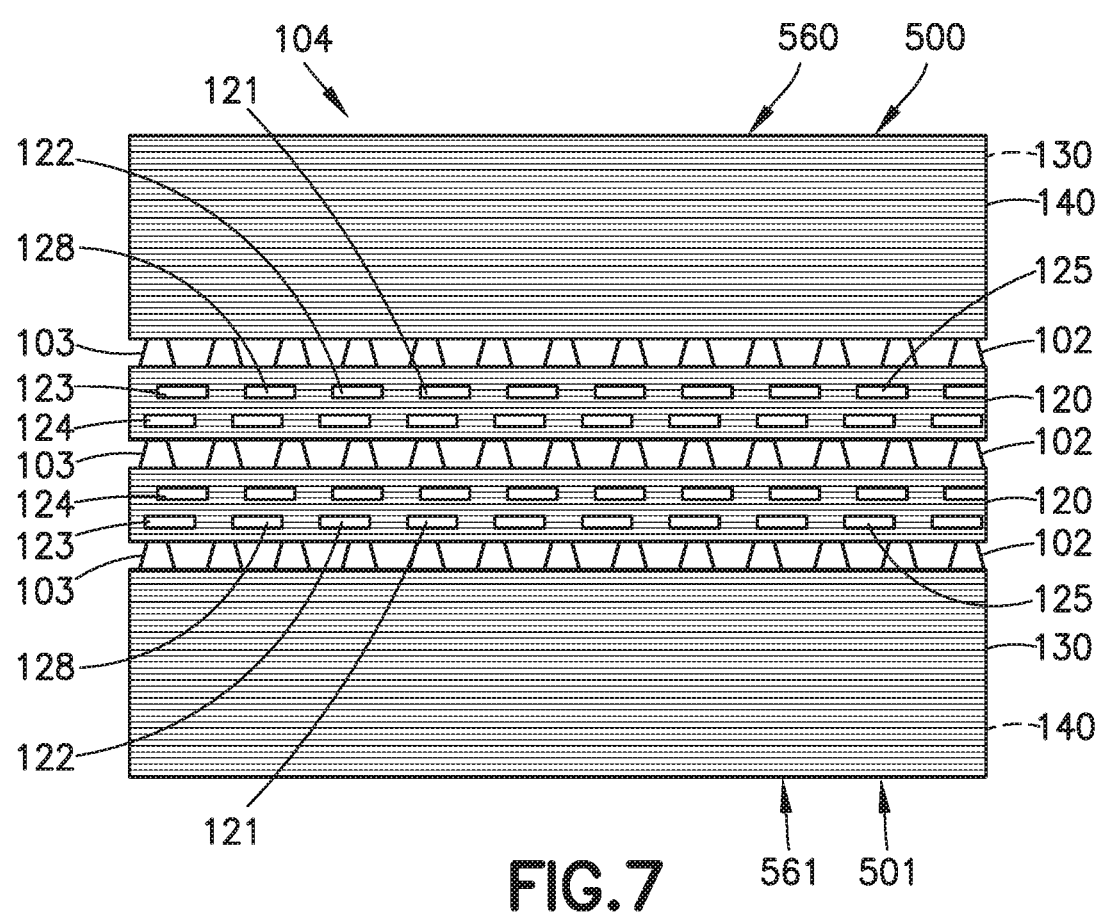
Figure 8:
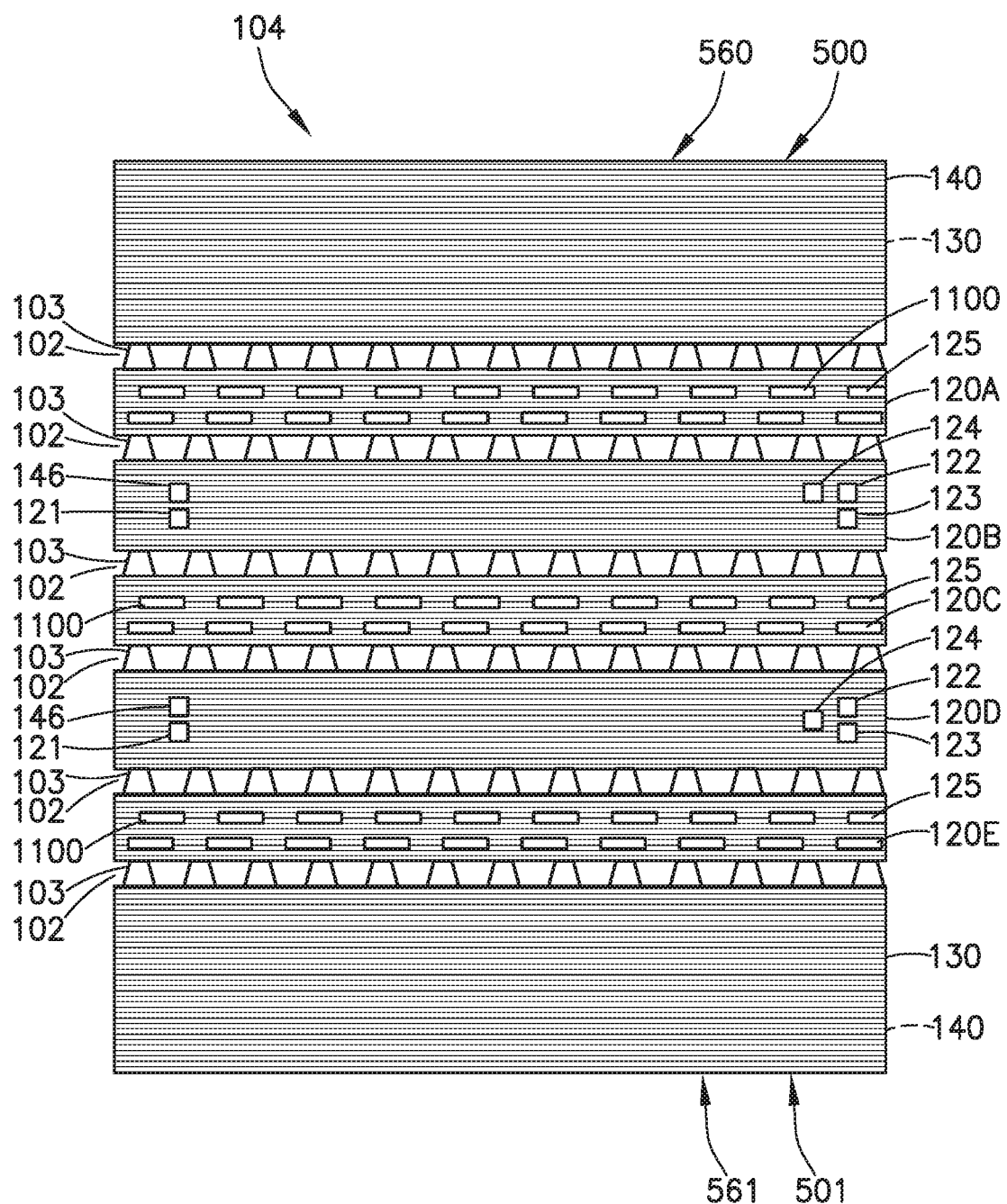
Figure 9:
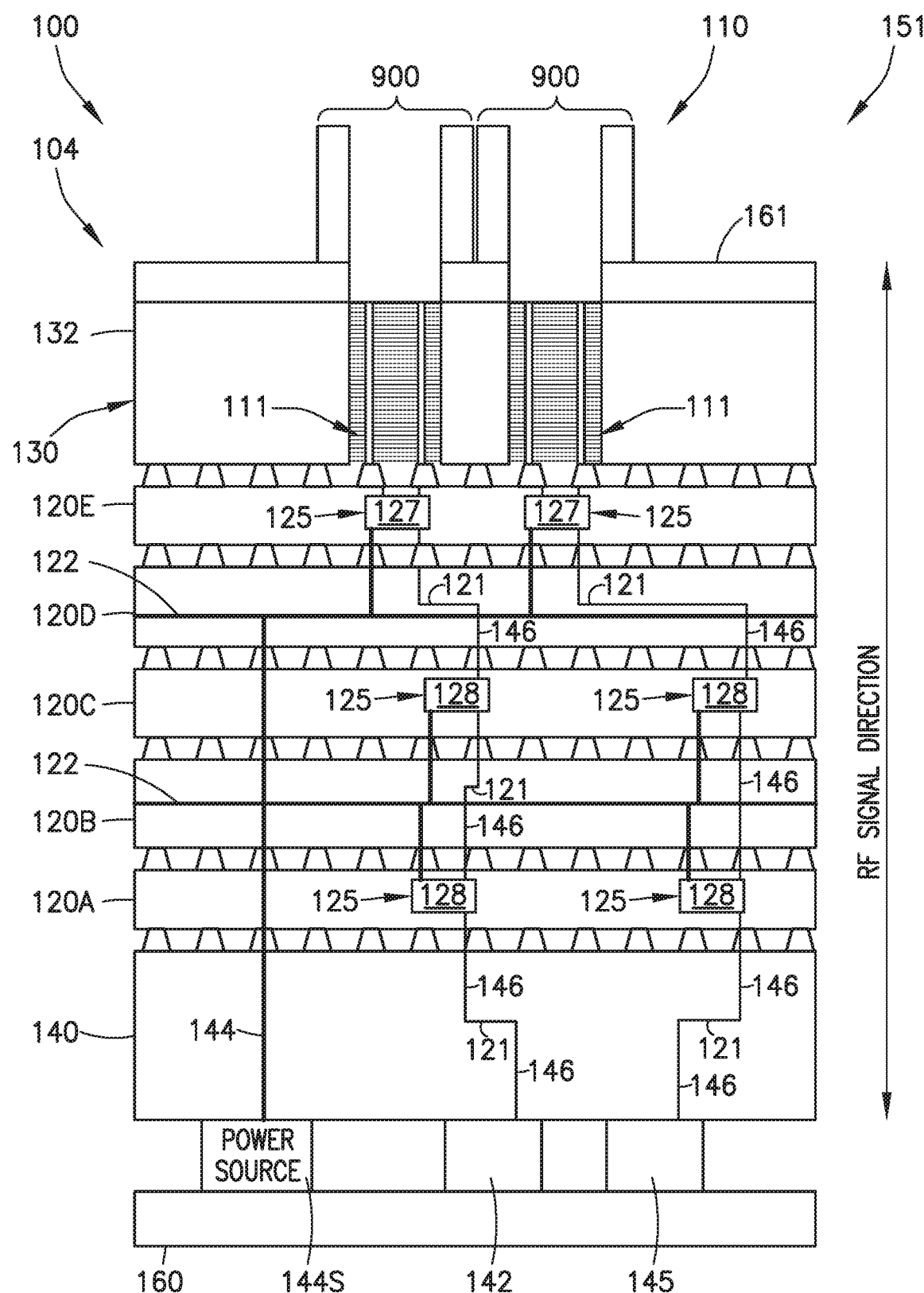
Figure 10:
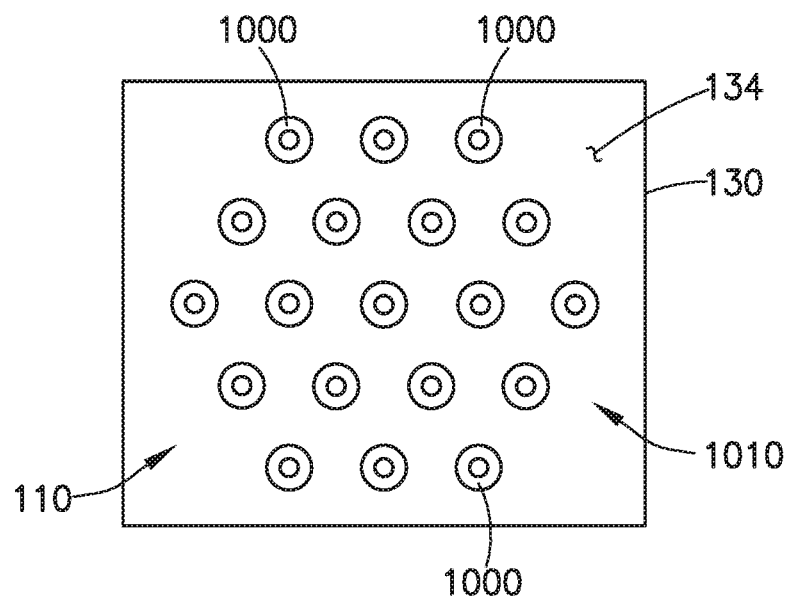
Figure 11:
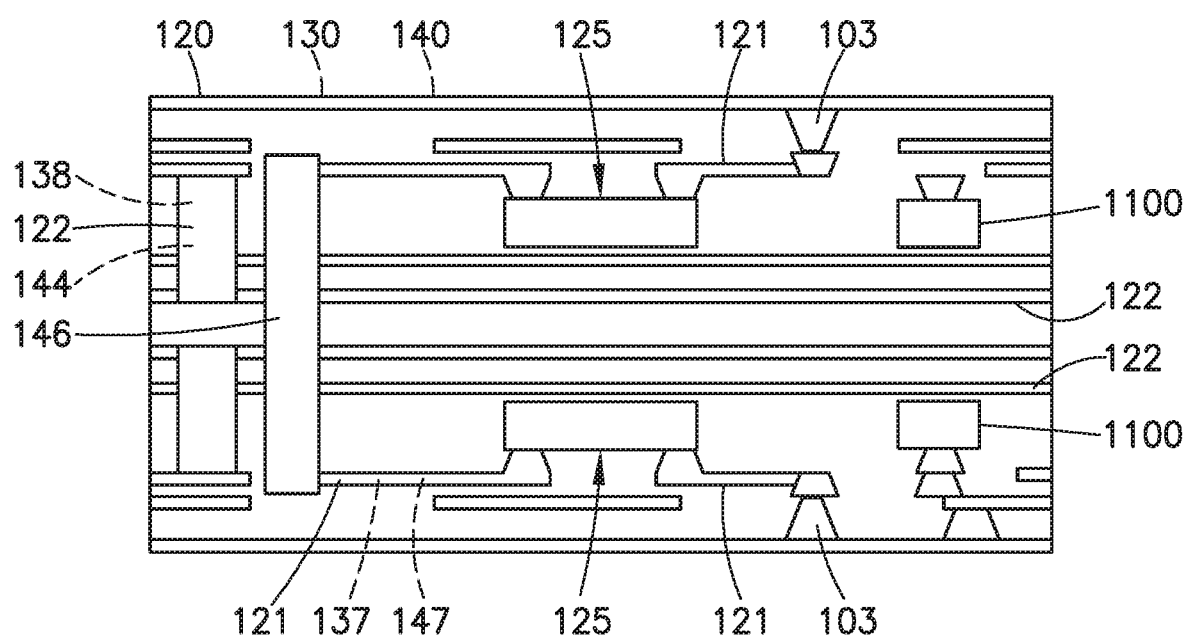
Figure 12:
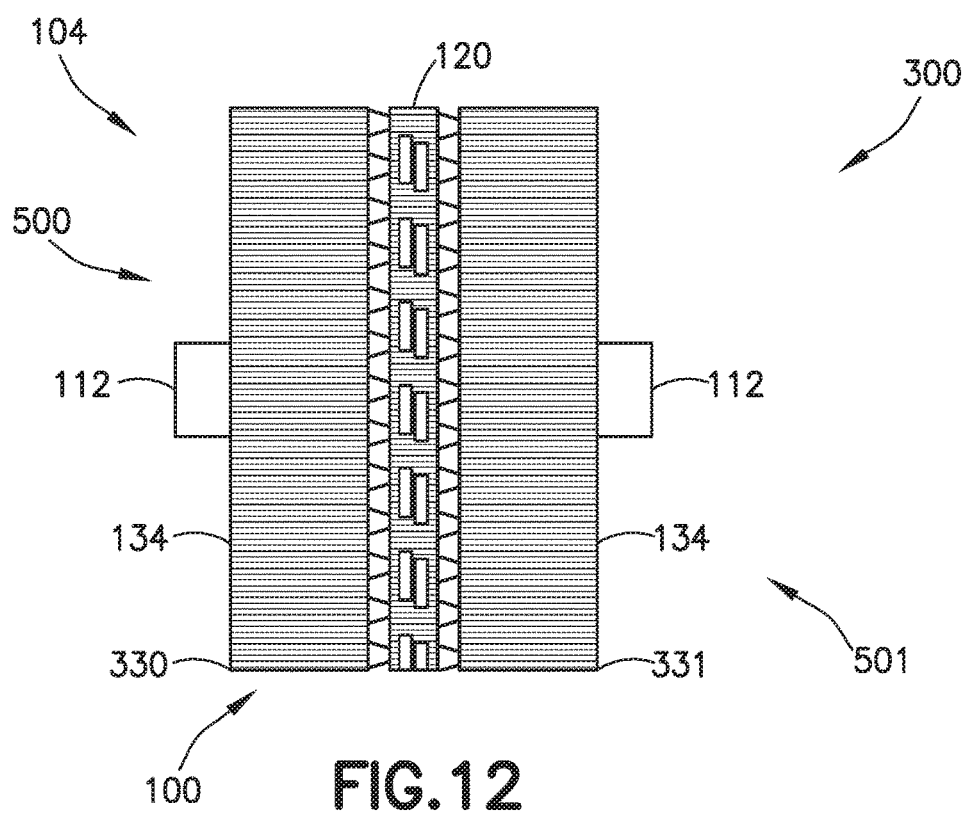
Figure 13:
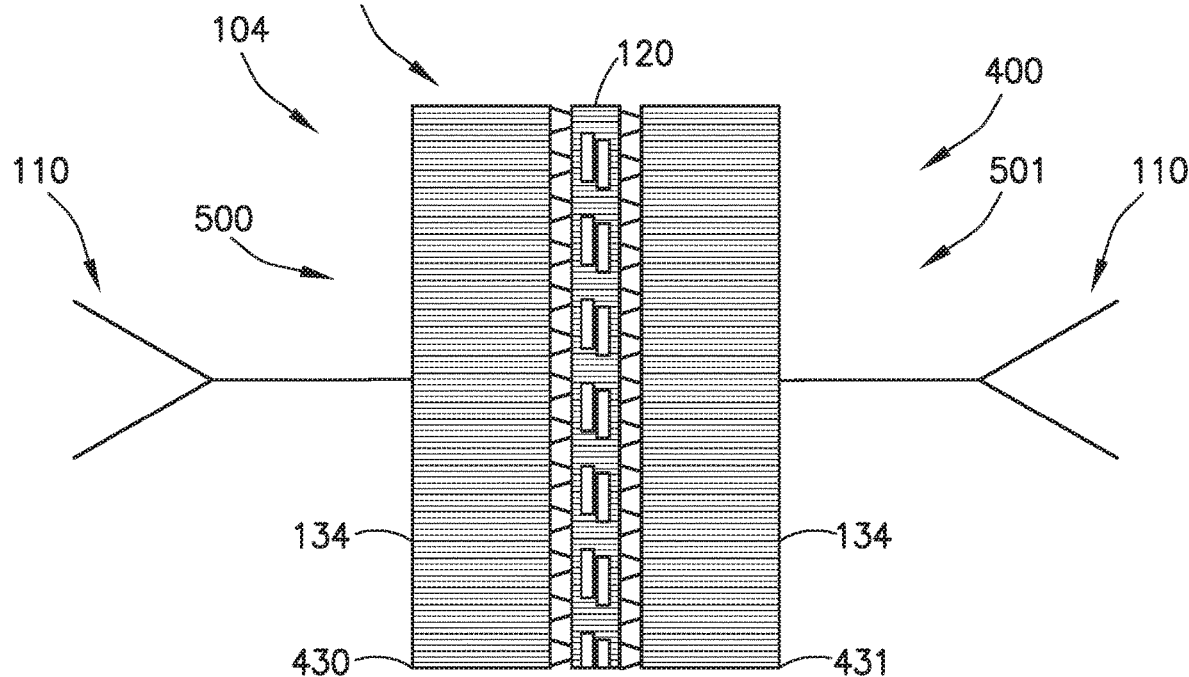
Figure 14A:
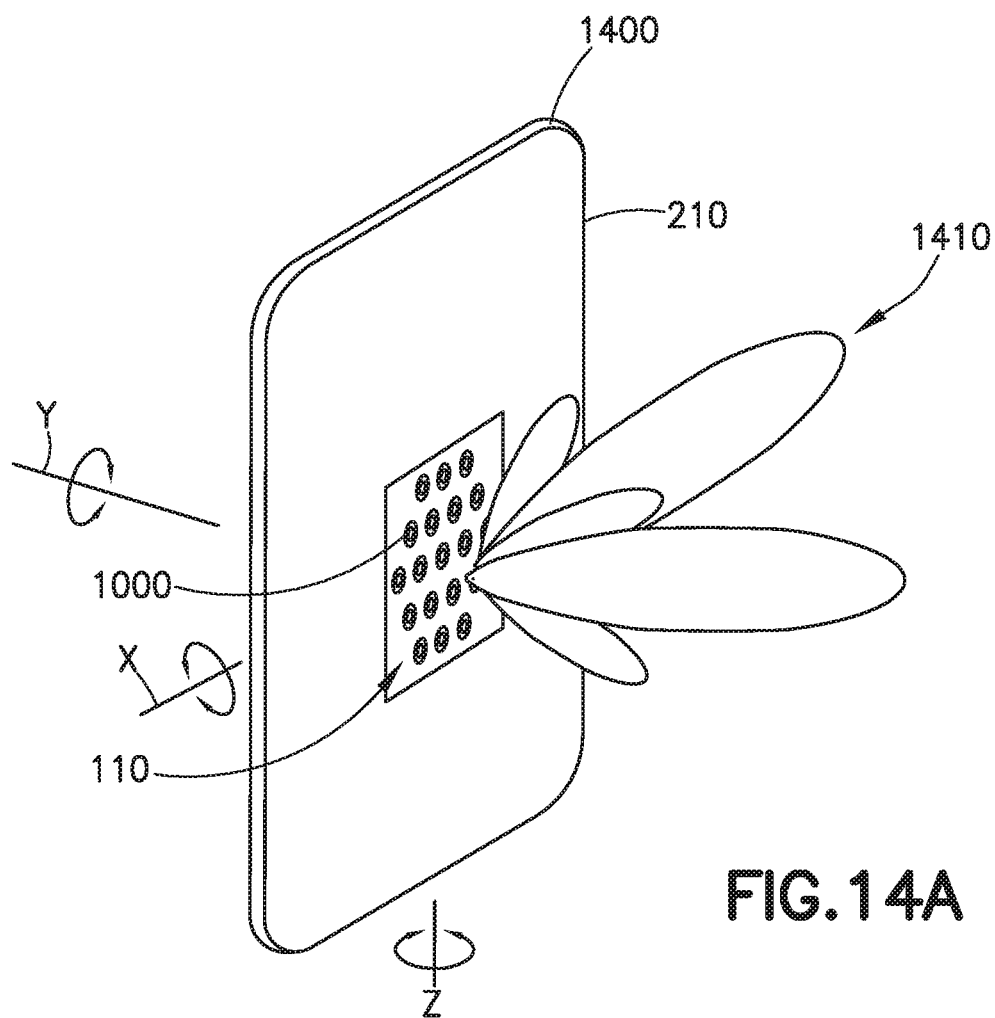
Figure 14B:
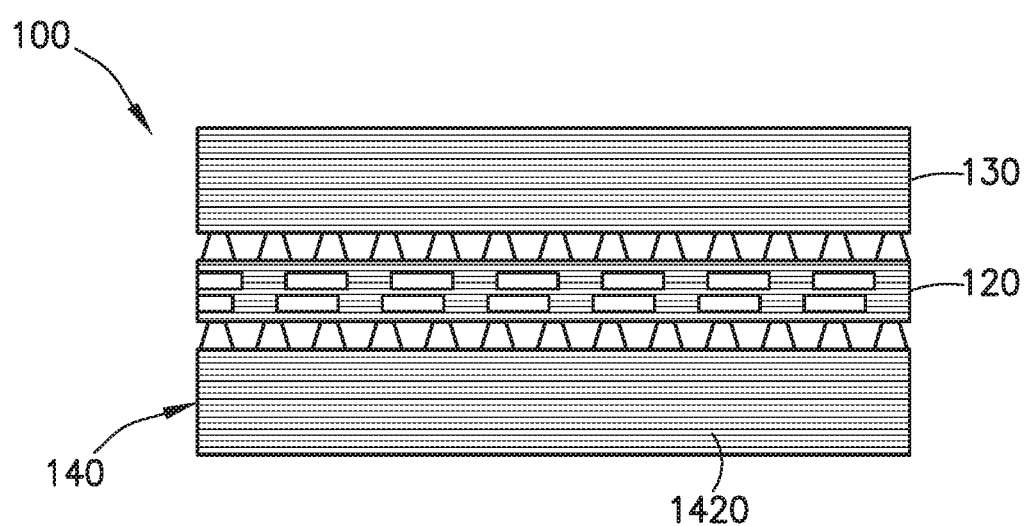

Having thus described examples of the present disclosure in general terms, reference will now be made to the accom- panying drawings, which are not necessarily drawn to scale, and wherein like references characters designate the same or similar parts throughout the several views, and wherein:

FIGS. 1A and 1B (collectively referred to herein as FIG. 1) are a schematic block diagram of a multi-embedded radio frequency board in accordance with aspects of the present disclosure;

FIG. 2 is a schematic block diagram of a mobile device including a multi-embedded radio frequency board in accordance with aspects of the present disclosure;

FIG. 3 is a schematic block diagram of a radio frequency signal repeater including a multi-embedded radio frequency board in accordance with aspects of the present disclosure;

FIG. 4 is a schematic block diagram of a radio frequency signal lens including a multi-embedded radio frequency board in accordance with aspects of the present disclosure;

FIG. 5 is an exemplary schematic diagram of a multi-embedded radio frequency board in accordance with aspects of the present disclosure;

FIG. 6 is an exemplary schematic diagram of a multi-embedded radio frequency board in accordance with aspects of the present disclosure;

FIG. 7 is an exemplary schematic diagram of a multi-embedded radio frequency board in accordance with aspects of the present disclosure;

FIG. 8 is an exemplary schematic diagram of a multi-embedded radio frequency board in accordance with aspects of the present disclosure;

FIG. 9 is an exemplary schematic diagram of a multi-embedded radio frequency board in the form of a radio frequency receiver in accordance with aspects of the present disclosure;

FIG. 10 is an exemplary schematic diagram of an antenna array of a multi-embedded radio frequency board in accordance with aspects of the present disclosure;

FIG. 11 is an exemplary schematic cross-sectional diagram of a portion of a multi-embedded radio frequency board in accordance with aspects of the present disclosure;

FIG. 12 is an exemplary schematic diagram the radio frequency signal repeater of FIG. 3 in accordance with aspects of the present disclosure;

FIG. 13 is an exemplary schematic diagram the radio frequency signal lens of FIG. 4 in accordance with aspects of the present disclosure; and FIGS. 14A and 14B are exemplary schematic illustrations respectively of the mobile device of FIG. 2 and a portion thereof.

DETAILED DESCRIPTION

Illustrative, non-exhaustive examples, which may or may not be claimed, of the subject matter according to the present disclosure are provided below. It is noted that the expression "radio frequency" may be referred to in this text and drawings by the acronym "RF".

Referring to FIG. 1, the aspects of the present disclosure provide for a multi-embedded radio frequency board 100 having an integrated circuit board module 101 that combines embedded radio frequency module printed circuit board(s) 120 with radio frequency signal generating printed circuit board(s) 140 and communication printed circuit board(s) 130 in a single integrated assembly. The multi-embedded radio frequency board 100 provides an increased surface area for mounting surface mount components or printed components (such as antennas) where the increase in surface area is effected through embedding components within the multi-embedded radio frequency board 100. For example, the integrated circuit board module 101 having multiple circuit boards stacked one board on top of the other boards so that components that would otherwise occupy the surface area of the multi-embedded radio frequency board 100 can be embedded within the circuit boards of the stack of printed circuit boards 104. The increased surface area provides for a larger array of antenna horns 110 to be coupled to the multi-embedded radio frequency board 100. The aspects of the present disclosure also provide increased capabilities (e.g., signal generation, signal processing, signal transmission, signal reception, signal routing, power routing, etc. as described herein) within the integrated circuit board module 101 of the multi-embedded radio frequency board 100. The integrated circuit board module 101 includes multiple circuit boards stacked one board on top of the other boards where adjacent circuit boards are coupled to each other by a respective interconnection join layer 102 that provides for the interconnection (e.g., radio frequency, power, control signals, etc.) and coupling of adjacent circuit boards through vias 103.

The stacked interconnection and coupling of the adjacent circuit boards of the integrated circuit board module 101 mitigate radio frequency signal loss that would otherwise occur as a result of transmission of the radio frequency signal through cables and would otherwise directly translate into a radio frequency power loss for a transmitter or a degradation to noise for a receiver. For example, an embedded radio frequency processing component (such as those described herein) may be placed substantially directly at feeds 111 of the array of antenna horns 110 in accordance with the aspects of the present disclosure.

The aspects of the present disclosure substantially eliminate human error in the assembly of the multi-embedded radio frequency board 100 and provide for low-cost-highly repeatable, and high performance phased array antenna systems, radio frequency repeater systems, and/or radio frequency lens systems. For example, any embedded components are disposed within a respective circuit board as that circuit board is formed and inspected in an automated machine process. Any surface mount components of the multi-embedded radio frequency board 100 are also coupled to the multi-embedded radio frequency board 100 and inspected in an automated machine process. Humans merely move subassemblies of the multi-embedded radio frequency board 100 from one automated machine process to another automated machine process.

The multi-embedded radio frequency board 100, in accordance with the aspects of the present disclosure, may be employed in receive and/or transmit phased array communications terminals. For example, the multi-embedded radio frequency board 100 of the present disclosure may be used to facilitate, as non-limiting examples, air-to-space communications, air-to-ground communications, air-to-air communications, ground-to-space communications, ground-to-ground communications, mobile-to-mobile space-to-ground communications, and space-to-space communications. The multi-embedded radio frequency board 100, in accordance with aspects of the present disclosure, may also be employed to receive and/or transmit actively scanned radars in, as non-limiting examples, airborne, land-based, sea, and space applications. The multi-embedded radio frequency board 100 may also be employed as a radio frequency signal repeater 300 (FIG. 3) or a radio frequency signal lens 400 (FIG. 4). The multi-embedded radio frequency board 100 may also provide for a steerable antenna for mobile applications (such as in a mobile device 200 (FIG. 2)). The aspects of the present disclosure may operate in any suitable frequency range(s) including, but not limited to, microwave frequency, millimeter frequencies, and 5G applications (and above).

Referring to FIGS. 1 and 5, the multi-embedded radio frequency board 100 includes a plurality of printed circuit boards 105 stacked one on the others so as to form stack of printed circuit boards 104. At least one of the printed circuit boards of the plurality of printed circuit boards 105 is configured so as to have a different processing function than another processing function of another printed circuit board of the plurality of printed circuit boards 105. For example, the different processing function comprises one or more of radio frequency signal generation, radio frequency transmission, radio frequency reception, heat dissipation, power distribution, radio frequency signal processing (e.g., amplification, conditioning), radio frequency transitions, and radio frequency signal routing. The another processing function (i.e., the different processing function) comprises a different one or more of radio frequency signal generation, radio frequency transmission, radio frequency reception, heat dissipation, power distribution, radio frequency signal processing (e.g., amplification, conditioning), radio frequency transitions, and radio frequency signal routing. In other aspects, two or more of the printed circuit boards of the plurality of printed circuit boards may have the same or a common processing function.

The plurality of printed circuit boards 105 includes at least one radio frequency signal generating printed circuit board 140, at least one embedded radio frequency module printed circuit board 120 communicably coupled to the at least one radio frequency signal generating printed circuit board 140, and at least one communication printed circuit board 130 communicably coupled to one or more of the at least one radio frequency signal generating printed circuit board 140 and/or the at least one embedded radio frequency module printed circuit board 120. The at least one radio frequency signal generating printed circuit board 140, the at least one embedded radio frequency module printed circuit board 120, and the at least one communication printed circuit board 130 are stacked one board on top of the others so as to form the stack of printed circuit boards 104. Adjacent boards of the at least one radio frequency signal generating printed circuit board 140, the at least one embedded radio frequency module printed circuit board 120, and the at least one communication printed circuit board 130 are coupled by a respective interconnection join layer 102 so as to form the integrated printed circuit board module 101. The interconnection join layer 102 is disposed between adjacent printed circuit boards of the plurality of printed circuit boards 105 so as to physically and electrically couple the adjacent printed circuit boards to each other so as to form the integrated printed circuit board module 101 having the predetermined radio frequency communication characteristic. The predetermined radio frequency communication characteristic may be one or more of radio frequency signal reception and transmission, radio frequency lensing, and radio frequency repetition.

The integrated printed circuit board module 101 and the interconnection join layers 102 thereof may provide for substantially lossless radio frequency signal couplings, substantially lossless power couplings, and substantially lossless control signal couplings between the adjacent boards. The stack of printed circuit boards 104 includes a first end 500 formed at least in part by a major surface 141 of at least one of the first end printed circuit board 560 (FIG. 5) (e.g., such as for example, the at least one radio frequency signal generating printed circuit board 140) and a second end 501 formed at least in part by a major surface 134 of at least one second end printed circuit board 561 (e.g., such as for example, the at least one communication printed circuit board 130). In one aspect, at least one of the first end printed circuit board 560 and the second end printed circuit board 561 (FIG. 5) comprises a radio frequency signal output printed circuit board 131 (FIG. 1). In one aspect, at least one of the first end printed circuit board 560 and the second end printed circuit board 561 comprises a radio frequency signal input printed circuit board 132 (FIG. 1). In another aspect, at least one of the first end printed circuit board 560 and the second end printed circuit board 561 comprises a radio frequency signal transceiver printed circuit board 133. While the at least one radio frequency signal generating printed circuit board 140 may be referred to as the first end printed circuit board and the at least one communication printed circuit board 130 may be referred to as the second end printed circuit board 561 in some aspects, in other aspects of the present disclosure each of the first end 500 and the second end 501 may include a communication printed circuit board 130.

Referring to 1, 5, and 10, the integrated printed circuit board module 101 is configured as a radio frequency signal transmitter 152. For example, the at least one communication printed circuit board 130 comprises a radio frequency signal output printed circuit board 131. In one aspect, the radio frequency signal output printed circuit board 131 includes an array of antenna horns 110 coupled thereto. In one aspect, the array of antenna horns 110 have a sub-frequency spacing, while in other aspects, the array of antenna horns 110 have a spacing that is a multiple of a frequency wavelength output by the radio frequency signal output printed circuit board 131. The array of antenna horns 110 may form a phased array antenna 1010 (FIG. 10). The array of antenna horns 110 include two or more antennas 1000 printed on the major surface 134 of the at least one communication printed circuit board 130; while in other aspects a single antenna 1000 may be printed on the major surface 134. In another aspect, the radio frequency signal output printed circuit board 131 includes a radio frequency connector 112 in addition to or in lieu of the array of antenna horns 110. The radio frequency connector 112 may provide for wired signal transmission from the radio frequency signal output printed circuit board 131.

In another aspect, the integrated printed circuit board module 101 is configured as a radio frequency signal receiver 151. For example, the at least one communication printed circuit board 130 (which may be one of the first end printed circuit board 560 (FIG. 5) and the second end printed circuit board 561 (FIG. 5)) includes a radio frequency signal input printed circuit board 132. The radio frequency signal input printed circuit board 132 includes an array of antenna horns 110 coupled thereto. In one aspect, the radio frequency signal input printed circuit board 132 includes at least one integrated circuit 177 configured to receive a radio frequency signal; while in other aspects the radio frequency signal may be received by an integrated circuit within any one of the boards in the stack of printed circuit boards 104. In one aspect, the array of antenna horns 110 have a sub-frequency spacing, while in other aspects, the array of antenna horns 110 have a spacing that is a multiple of a frequency wavelength input to the radio frequency signal input printed circuit board 132. The array of antenna horns 110 may form a phased array antenna 1010 (FIG. 10). The array of antenna horns 110 include two or more antennas 1000 printed on the major surface 134 of the at least one communication printed circuit board 130; while in other aspects a single antenna 1000 may be printed on the major surface 134. In another aspect, the radio frequency signal input printed circuit board 132 includes a radio frequency connector 112 in addition to or in lieu of the array of antenna horns 110. The radio frequency connector 112 may provide for wired signal transmission to the radio frequency signal input printed circuit board 132.

In still another aspect, the integrated printed circuit board module 101 is configured as a radio frequency signal transceiver 150. For example, the at least one communication printed circuit board 130 comprises a radio frequency signal transceiver printed circuit board 133. In one aspect, the radio frequency signal transceiver printed circuit board 133 includes an array of antenna horns 110 coupled thereto. In one aspect, the array of antenna horns 110 have a sub-frequency spacing, while in other aspects, the array of antenna horns 110 have a spacing that is a multiple of a frequency wavelength input to the radio frequency signal input printed circuit board 132. The array of antenna horns 110 may form a phased array antenna 1010 (FIG. 10). The array of antenna horns 110 include two or more antennas 1000 printed on the major surface 134 of the at least one communication printed circuit board 130; while in other aspects a single antenna 1000 may be printed on the major surface 134. In another aspect, the radio frequency signal transceiver printed circuit board 133 includes a radio frequency connector 112 in addition to or in lieu of the array of antenna horns 110. The radio frequency connector 112 may provide for wired signal transmission to and from the radio frequency signal transceiver printed circuit board 133.

The at least one communication printed circuit board 130 includes radio frequency strip lines 137 configured to route radio frequency signals to and from adjacent printed circuit boards (such as to one or more of the at least one embedded radio frequency module printed circuit board 120 and the at least one radio frequency signal generating printed circuit board 140). In one aspect, the at least one communication printed circuit board 130 includes heat dissipation 139, such as conductive traces coupled to any suitable heat sink 161 coupled to the at least one communication printed circuit board 130.

Referring to FIGS. 1 and 5, the at least one radio frequency signal generating printed circuit board 140 (which is may be one of the first end printed circuit board 560 (FIG. 5) and the second end printed circuit board 561 (FIG. 5)) includes at least one integrated circuit 142 configured to generate a radio frequency signal. The integrated circuit 142 may be surface mounted to the major surface 141 of the at least one radio frequency signal generating printed circuit board 140 or the integrated circuit may be embedded within the at least one radio frequency signal generating printed circuit board 140. The at least one radio frequency signal generating printed circuit board 140 includes one or more of heat dissipation 143 (such as conductive traces coupled to any suitable heat sink 160 coupled to the at least one radio frequency signal generating printed circuit board 140), power distribution 144, radio frequency signal processing 145 (e.g., amplification, conditioning), and radio frequency transitions 146. The at least one radio frequency signal generating printed circuit board 140 includes radio frequency strip lines 147 configured to route radio frequency signals to and from adjacent printed circuit boards (such as to one or more of the at least one embedded radio frequency module printed circuit board 120 and the at least one communication printed circuit board 130)

Referring to FIGS. 1 and 5, the at least one embedded radio frequency module printed circuit board 120 is disposed between the at least one radio frequency signal generating printed circuit board 140 and the at least one communication printed circuit board 130. The a least one embedded radio frequency module printed circuit board 120 forms at least one intermediate printed circuit board 510 (see FIG. 5) disposed in the stack of printed circuit boards 104 between a first end printed circuit board 560 (such as in one aspect, e.g., the at least one radio frequency signal generating printed circuit board 140) and a second end printed circuit board 561 (such as in one aspect, e.g., the at least one communication printed circuit board 130). As an intermediate printed circuit board 510, the at least one embedded radio frequency module printed circuit board 120 includes radio frequency strip lines 121 configured to route radio frequency signals at least between adjacent printed circuit boards. The at least one embedded radio frequency module printed circuit board 120 includes power distribution 122 routing to one or more adjacent printed circuit boards. The at least one embedded radio frequency module printed circuit board 120 includes one or more of an input control module 123 and output control module 124 embedded within the at least one embedded radio frequency module printed circuit board 120, where the input control module 123 and output control module 124 may send control signals to the integrated circuits 142 of the at least one radio frequency signal generating printed circuit board 140 or other suitable modules (e.g., power distribution modules, signal processing modules, etc.) embedded in one or more of the at least one embedded radio frequency module printed circuit board 120, the at least one of the radio frequency signal generating printed circuit board 140, and the at least one communication printed circuit board 130.

Referring to FIGS. 1, 5 and 11, in one aspect, the at least one embedded radio frequency module printed circuit board 120 includes a radio frequency signal processing device 125 embedded within the at least one embedded radio frequency module printed circuit board 120. The a radio frequency signal processing device 125 may be substantially similar to a radio frequency signal processing device 148 that effects radio frequency signal processing 145 in the at least one radio frequency signal generating printed circuit board 140. The radio frequency signal processing device 125 is an integrated circuit 126, a radio frequency signal amplifier 127, a radio frequency signal conditioner 128, or a combination thereof.

Referring to FIGS. 1, 5, and 11, the at least one embedded radio frequency module printed circuit board comprises radio frequency strip lines 121 configured to route radio frequency signals at least between adjacent printed circuit boards of the stack of printed circuit boards 104. The at least one embedded radio frequency module printed circuit board 120 also includes power distribution 122 routing to one or more adjacent printed circuit boards of the stack of printed circuit boards 104. In one aspect, the power distribution 122 of the at least one embedded radio frequency module printed circuit board 120 may include at least one capacitor 1100 (FIG. 11) embedded within the at least one embedded radio frequency module printed circuit board 120; while in other aspects any suitable power source may be provided. The at least one embedded radio frequency module printed circuit board 120 may include at least one direct current filtering device 129 embedded within the at least one intermediate printed circuit board 510 (see FIG. 5). In one aspect, the at least one direct current filtering device 129 may be part of the power distribution 122, while in other aspects, the at least one direct current filtering device 129 may be coupled to the power distribution 122 in any suitable manner. The at least one direct current filtering device 129 may provide regulated power to one or more of the embedded modules described herein. FIG. 11 is illustrative of the manner in which embedded modules are embedded into the one or more of the at least one embedded radio frequency module printed circuit board 120. FIG. 11 is also illustrative of the radio frequency strip lines 121, radio frequency transitions 146, and power distribution 122 of the embedded radio frequency module printed circuit board 120.

In some aspects of the present disclosure one or more of the at least one radio frequency signal generating printed circuit board 140 and the at least one communication printed circuit board 130 include embedded modules, such as those described herein and with respect to the at least one embedded radio frequency module printed circuit board 120. As such, in these aspects FIG. 11 is also illustrative of the manner in which the embedded modules are embedded into the one or more of the at least one radio frequency signal generating printed circuit board 140 and the at least one communication printed circuit board 130. FIG. 11 is also illustrative of the radio frequency strip lines 137, 147, radio frequency transitions 146, and power distribution 138, 144 (which are substantially similar to the radio frequency strip lines 121 and power distribution 122) of the at least one radio frequency signal generating printed circuit board 140 and the at least one communication printed circuit board 130.

Referring to FIGS. 1 and 6-8 the multi-embedded radio frequency board 100 may include any suitable number of printed circuit boards within the stack of printed circuit boards 104, where each board is coupled to an adjacent board by a respective interconnection join layer. For example, FIG. 6 illustrates an example where the multi-embedded radio frequency board 100 includes three printed circuit boards, e.g., a radio frequency signal generating printed circuit board 140 (disposed at either the first end 500 or the second end 501), an embedded radio frequency module printed circuit board 120, and a communication printed circuit board (disposed at the other of the first end 500 or the second end 501).

FIG. 7 illustrates an example where the multi-embedded radio frequency board 100 includes four printed circuit boards, e.g., a radio frequency signal generating printed circuit board 140 (disposed at either the first end 500 or the second end 501), two embedded radio frequency module printed circuit boards 120, and a communication printed circuit board (disposed at the other of the first end 500 or the second end 501). In this example, each of the embedded radio frequency module printed circuit boards 120 may have radio frequency signal processing devices 125 performing one or more different functions.

FIG. 8 illustrates an example where the multi-embedded radio frequency board 100 includes seven printed circuit boards, e.g., a radio frequency signal generating printed circuit board 140 (disposed at either the first end 500 or the second end 501), five embedded radio frequency module printed circuit boards 120A-120E, and a communication printed circuit board (disposed at the other of the first end 500 or the second end 501). In this example, each of the embedded radio frequency module printed circuit boards 120 may have radio frequency signal processing devices 125 performing one or more different functions. For example, radio frequency module printed circuit boards 120A, 120C, 120E may include one or more radio frequency signal processing devices 125 and/or capacitors 1100. Radio frequency module printed circuit boards 120B, 120D may include radio frequency strip lines 121, radio frequency transitions 146, power distribution 122, input control module 123, and/or output control module 124. In other aspect, each of the radio frequency module printed circuit boards 120A-120E may be suitably configured to perform alone or in combination with other boards of the radio frequency module printed circuit boards 120A-120E any suitable control and signal processing functions.

Referring to FIGS. 1 and 9, an example of the multi-embedded radio frequency board 100 including seven printed circuit boards is illustrated. In this example the multi-embedded radio frequency board 100 is configured as a radio frequency signal transceiver 150; however, in other aspects the multi-embedded radio frequency board 100 may be configured as the radio frequency signal transmitter 152 or the radio frequency signal receiver 151. In this example, the radio frequency signal generating printed circuit board 140 includes surface mount (in other aspects could be embedded) radio frequency signal processing components (e.g., integrated circuits 142, radio frequency signal processing modules 145, etc.) and a power distribution 144 (including power source 144S). Embedded radio frequency module printed circuit board 120A is configured for radio frequency signal conditioning and includes any suitable radio frequency signal processing devices 125 such as one or more radio frequency signal conditioner 128 modules/integrated circuits coupled to the radio frequency signal processing components of the radio frequency signal generating printed circuit board 140. The embedded radio frequency module printed circuit board 120B is configured as a radio frequency routing layer (e.g., radio frequency transitions 146 and radio frequency strip lines 121 that couple the embedded components of the adjacent embedded radio frequency module printed circuit boards 120A, 120C). The embedded radio frequency module printed circuit board 120B also includes power distribution 122 (e.g., for supplying power to the embedded modules of embedded radio frequency module printed circuit boards 120A, 120C). Embedded radio frequency module printed circuit board 120C is configured as another signal conditioning layer (that performs different signal conditioning than that of embedded radio frequency module printed circuit board 120A) that includes any suitable radio frequency signal processing devices 125 such as one or more radio frequency signal conditioner 128 modules/integrated circuits coupled to the radio frequency signal processing components of the embedded radio frequency module printed circuit boards 120A, 120E. Embedded radio frequency module printed circuit board 120D is configured as another radio frequency routing layer (e.g., radio frequency transitions 146 and radio frequency strip lines 121 that couple the embedded components of the adjacent embedded radio frequency module printed circuit boards 120C, 120E). The embedded radio frequency module printed circuit board 120D also includes power distribution 122 (e.g., for supplying power to the embedded modules of embedded radio frequency module printed circuit board 120E). Embedded radio frequency module printed circuit board 120E is configured as an amplifier layer and includes one or more radio frequency signal amplifiers 127 and any other suitable radio frequency signal processing devices 125 that are coupled to feeds 111 of respective antenna horns 900 of the array of antenna horns 110 of the communication printed circuit board 130 (which is configured as the radio frequency input printed circuit board 132). As can be seen in FIG. 9, each of the embedded radio frequency module printed circuit board 120A, 120B, 120C, 120D, 120E is configured for a respective frequency processing function (e.g., different from another function performed by another embedded radio frequency module printed circuit board in the stack of printed circuit boards 104).

Referring to FIGS. 1 and 2, the multi-embedded radio frequency board 100 may be included in a mobile device 200 so as to perform radio frequency signal reception and/or transmission. The mobile device may be a handheld communication device 1400 (e.g., cellular phone, handheld radio, etc.), a spacecraft 201 (e.g., satellite, space shuttle, space capsule, telescope, etc.), an aircraft 202 (lighter than air vehicle, fixed wing aircraft, variable wing aircraft, tilt-rotor aircraft, rotary wing aircraft, etc.), a maritime vessel 203, or terrestrial vehicle 204. The mobile device 200 includes any suitable frame 210 to which the multi-embedded radio frequency board 100 is coupled. For exemplary purposes, referring also to FIGS. 14A and 14B, the mobile device is illustrated as a mobile/cellular phone where the multi-embedded radio frequency board 100 includes a radio frequency signal generating printed circuit board 140, and embedded radio frequency module printed circuit board 120, and a communication printed circuit board 130. While the multi-embedded radio frequency board 100 includes a stack of printed circuit boards 104 that includes three circuit boards, in other aspects, the stack of printed circuit boards 104 may include any suitable number of printed circuit boards, depending on, e.g., predetermined processing functions of the mobile device 200. The radio frequency signal generating printed circuit board 140 (which as described herein may be the first end printed circuit board 560 or the second end printed circuit board 561) may be as described herein and include any suitable integrated circuits 142 (or other suitable processors) and radio frequency signal processing 145 so as to configure the radio frequency signal generating printed circuit board 140 as a mobile communication device processor printed circuit board 1420 programmed to make, receive, and process cellular signals. The embedded radio frequency module printed circuit board 120 and the communication printed circuit board 130 may be as described herein, however in this aspect the communication printed circuit board 130 may be configured as a radio frequency signal transceiver printed circuit board 133 so as to send and receive cellular (or any other suitable radio frequency wavelength) signals 1410. In other aspects, the mobile device 200 may include the radio frequency signal input printed circuit board 132 and/or the radio frequency output printed circuit board 131 described above. In this aspect, the multi-embedded radio frequency board 100 is coupled to the frame 210 so that the array of antenna horns 110 is exposed (or if the frame is radio frequency wave transparent the antenna horns may not be exposed) so as to transmit and receive the cellular signals 1410. In this aspect, the array of antenna horns 110 is steerable, so as to point the array of antenna horns 110 to a particular target, by rotating (or otherwise changing an orientation) the handheld communication device 1400 (e.g., about one or more axes of rotation X, Y, Z).

Where the mobile device comprises a spacecraft 201, an aircraft 202, or a maritime vessel 203, the antenna array of the multi-embedded radio frequency board 100 coupled thereto may be pointed in a manner similar to that described above with respect to the handheld communication device 1400 (e.g., by changing an attitude/orientation of the mobile device 200). In other aspects, the multi-embedded radio frequency board 100 may be coupled to the spacecraft 201, the aircraft 202, or the maritime vessel 203 with a gimballed coupling so that the multi-embedded radio frequency board 100 may be pointed in a predetermined direction independent of the attitude/orientation of the mobile device 200.

Referring to FIGS. 1, 3, and 12, the aspects of the present disclosure may provide for a radio frequency signal repeater 300 that includes the multi-embedded radio frequency board 100, so as to perform radio frequency repetition. For example, the radio frequency signal repeater 300 includes an integrated printed circuit board module 101 having a first communication printed circuit board 330, a second communication printed circuit board 331, and at least one embedded radio frequency module printed circuit board 120 disposed between and communicably coupled to both the first communication printed circuit board 330 and the second communication printed circuit board 331. The at least one embedded radio frequency module printed circuit board 120 may be as described herein. The first communication printed circuit board 330 and the second communication printed circuit board 331 may be substantially similar to communication printed circuit board 130 described herein. The at least one embedded radio frequency module printed circuit board 120, the first communication printed circuit board 330, and the second communication printed circuit board 331 are stacked one board on top of the others as described herein. Adjacent boards of the at least one embedded radio frequency module printed circuit board 120, the first communication printed circuit board 330, and the second communication printed circuit board 331 are coupled by a respective interconnection join layer 102 so as to form the integrated printed circuit board module 101.

The at least one embedded radio frequency module printed circuit board 120, the first communication printed circuit board 330, and the second communication printed circuit board 331 form the stack of printed circuit boards 140 having the first end 500 formed at least in part by the major surface 134 of the first communication printed circuit board 330 and a second end 501 formed at least in part by the major surface 134 of the second communication printed circuit board 331. One of the first communication printed circuit board 330 and the second communication printed circuit board 331 comprises a radio frequency signal output printed circuit board 131 and the other board of the first communication printed circuit board 330 and the second communication printed circuit board 331 comprises a radio frequency signal input printed circuit board 132. The radio frequency signal input printed circuit board 132 and the radio frequency signal output printed circuit board 131 provide for the input and output of a common radio frequency signal so as to repeat the incoming radio frequency signal. The at least one embedded radio frequency module printed circuit board 120 may be as described herein and include any suitable radio frequency signal conditioner 128 and/or radio frequency signal amplifier 127 for amplifying and/or conditioning the repeated radio frequency signal. In other aspects, the radio frequency signal repeater 300 may be bidirectional where the first communication printed circuit board 330 and the second communication printed circuit board 331 each include the radio frequency signal transceiver printed circuit board 133.

In one aspect, the radio frequency signal output printed circuit board 131 (or the radio frequency signal transceiver printed circuit board 133) comprises the radio frequency connector 112 coupled thereto (and/or array of antenna horns 110) for outputting the repeated radio frequency signal. The radio frequency signal input printed circuit board 132 (or the radio frequency signal transceiver printed circuit board 133) comprises the radio frequency connector 112 coupled thereto (and/or array of antenna horns 110) for inputting the repeated radio frequency signal to the radio frequency signal repeater 300.

Referring to FIGS. 1, 4, and 13, the aspects of the present disclosure may provide for a the radio frequency signal lens 400 that includes the multi-embedded radio frequency board 100, so as to perform radio frequency lensing (e.g., one or more of focusing, redirecting, and amplification). For example, the radio frequency signal lens 400 includes a first communication printed circuit board 430, a second communication printed circuit board 431, and at least one embedded radio frequency module printed circuit board 120 disposed between and communicably coupled to both the first communication printed circuit board 430 and the second communication printed circuit board 431. The at least one embedded radio frequency module printed circuit board 120, the first communication printed circuit board 430, and the second communication printed circuit board 431 are stacked one board on top of the others as described herein. Adjacent boards of the at least one embedded radio frequency module printed circuit board 120, the first communication printed circuit board 430, and the second communication printed circuit board 431 are coupled by a respective interconnection join layer 102 so as to form the integrated printed circuit board module 101. The at least one embedded radio frequency module printed circuit board 120 may be as described herein. The first communication printed circuit board 430 and the second communication printed circuit board 431 may be substantially similar to communication printed circuit board 130 described herein.

The at least one embedded radio frequency module printed circuit board 120, the first communication printed circuit board 430, and the second communication printed circuit board 431 form the stack of printed circuit boards 104 having the first end 500 formed at least in part by the major surface 134 of the first communication printed circuit board 430 and a second end 501 formed at least in part by the major surface 134 of the second communication printed circuit board 431. One of the first communication printed circuit board 430 and the second communication printed circuit board 431 comprises a radio frequency signal output printed circuit board 131 (as described herein) and the other of the first communication printed circuit board 430 and the second communication printed circuit board 431 comprises a radio frequency signal input printed circuit board 132 (as described herein). In one aspect, the radio frequency signal lens 400 may be bidirectional where at least one of the first communication printed circuit board 430 and the second communication printed circuit board 431 comprises the radio frequency signal transceiver printed circuit board 133.

The following are provided in accordance with the aspects of the present disclosure:

A1. A multi-embedded radio frequency board comprising:
at least one radio frequency signal generating printed circuit board;
at least one embedded radio frequency module printed circuit board communicably coupled to the at least one radio frequency signal generating printed circuit board; and
at least one communication printed circuit board communicably coupled to one or more of the at least one radio frequency signal generating printed circuit board or the at least one embedded radio frequency module printed circuit board;
wherein
the at least one radio frequency signal generating printed circuit board, the at least one embedded radio frequency module printed circuit board, and the at least one communication printed circuit board are stacked one board on top of the others, and adjacent boards of the at least one radio frequency signal generating printed circuit board, the at least one embedded radio frequency module printed circuit board, and the at least one communication printed circuit board are coupled by a respective interconnection join layer so as to form an integrated printed circuit board module.

A2. The multi-embedded radio frequency board of paragraph A1, wherein the at least one radio frequency signal generating printed circuit board, the at least one embedded radio frequency module printed circuit board, and the at least one communication printed circuit board form a stack of printed circuit boards having a first end formed at least in part by a major surface of the at least one radio frequency signal generating printed circuit board and a second end formed at least in part by a major surface of the at least one communication printed circuit board.

A3. The multi-embedded radio frequency board of paragraph A1, wherein the at least one communication printed circuit board comprises a radio frequency signal output printed circuit board.

A4. The multi-embedded radio frequency board of paragraph A3, wherein the radio frequency signal output printed circuit board includes an array of antenna horns coupled thereto.

A5. The multi-embedded radio frequency board of paragraph A4, wherein the array of antenna horns have a sub-frequency spacing or a spacing that is a multiple of a frequency wavelength.

A6. The multi-embedded radio frequency board of paragraph A3, wherein the radio frequency signal output printed circuit board comprises a radio frequency connector.

A7. The multi-embedded radio frequency board of paragraph A1 (or any one of A3-A6), wherein the at least one communication printed circuit board comprises a radio frequency signal input printed circuit board.

A8. The multi-embedded radio frequency board of paragraph A7, wherein the radio frequency signal input printed circuit board includes an array of antenna horns coupled thereto.

A9. The multi-embedded radio frequency board of paragraph A8, wherein the array of antenna horns have a sub-frequency spacing or a spacing that is a multiple of a frequency wavelength.

A10. The multi-embedded radio frequency board of paragraph A7, wherein the radio frequency signal input printed circuit board comprises a radio frequency connector.

A11. The multi-embedded radio frequency board of paragraph A1, wherein the at least one communication printed circuit board comprises a radio frequency signal transceiver printed circuit board.

A12. The multi-embedded radio frequency board of paragraph A11, wherein the radio frequency signal transceiver printed circuit board includes an array of antenna horns coupled thereto.

A13. The multi-embedded radio frequency board of paragraph A12, wherein the array of antenna horns have a sub-frequency spacing or a spacing that is a multiple of a frequency wavelength.

A14. The multi-embedded radio frequency board of paragraph A11, wherein the radio frequency signal transceiver printed circuit board comprises a radio frequency connector.

A15. The multi-embedded radio frequency board of paragraph A1, wherein the integrated printed circuit board module is configured as a radio frequency signal receiver.

A16. The multi-embedded radio frequency board of paragraph A1, wherein the integrated printed circuit board module is configured as a radio frequency signal transmitter.

A17. The multi-embedded radio frequency board of paragraph A1, wherein the integrated printed circuit board module is configured as a radio frequency signal transceiver.

A18. The multi-embedded radio frequency board of paragraph A1, wherein the at least one radio frequency signal generating printed circuit board includes at least one integrated circuit configured to generate a radio frequency signal.

A19. The multi-embedded radio frequency board of paragraph A18, wherein the at least one radio frequency signal generating printed circuit board includes one or more of heat dissipation, power distribution, radio frequency signal processing (e.g., amplification, conditioning), radio frequency transitions.

A20. The multi-embedded radio frequency board of paragraph A1, wherein the at least one embedded radio frequency module printed circuit board is disposed between the at least one radio frequency signal generating printed circuit board and the at least one communication printed circuit board, the at least one embedded radio frequency module printed circuit board comprises one or more of an input and output control module embedded within the at least one embedded radio frequency module printed circuit board.

A21. The multi-embedded radio frequency board of paragraph A1 (or A20), wherein the at least one embedded radio frequency module printed circuit board is disposed between the at least one radio frequency signal generating printed circuit board and the at least one communication printed circuit board, the at least one embedded radio frequency module printed circuit board comprises a radio frequency signal processing device embedded within the at least one intermediate printed circuit board.

A22. The multi-embedded radio frequency board of paragraph A21, wherein the radio frequency signal processing device comprises an integrated circuit.

A23. The multi-embedded radio frequency board of paragraph A21, wherein the radio frequency signal processing device comprises a radio frequency signal amplifier.

A24. The multi-embedded radio frequency board of paragraph A21, wherein the radio frequency signal processing device comprises a radio frequency signal conditioner.

A25. The multi-embedded radio frequency board of paragraph A1 (or any one of A20 and A21), wherein the at least one embedded radio frequency module printed circuit board is disposed between the at least one radio frequency signal generating printed circuit board and the at least one communication printed circuit board, the at least one embedded radio frequency module printed circuit board comprises radio frequency strip lines configured to route radio frequency signals at least between adjacent printed circuit boards.

A26. The multi-embedded radio frequency board of paragraph A1 (or any one of A20, A21, and A25), wherein the at least one embedded radio frequency module printed circuit board is disposed between the at least one radio frequency signal generating printed circuit board and the at least one communication printed circuit board, the at least one embedded radio frequency module printed circuit board comprises power distribution routing to one or more adjacent printed circuit boards.

A27. The multi-embedded radio frequency board of paragraph A1 (or any one of A20, A21, A25, and A26), wherein the at least one embedded radio frequency module printed circuit board is disposed between the at least one radio frequency signal generating printed circuit board and the at least one communication printed circuit board, the at least one embedded radio frequency module printed circuit board comprises at least one direct current filtering device embedded within the at least one intermediate printed circuit board.

A28. The multi-embedded radio frequency board of paragraph A1, further comprising a heat sink coupled to one or more of the at least one radio frequency signal generating printed circuit board and the at least one communication printed circuit board.

B1. A multi-embedded radio frequency board comprising:

a plurality of printed circuit boards stacked one on the others, at least one of the printed circuit boards of the plurality of printed circuit boards being configured so as to have a different processing function than another processing function of another printed circuit board of the plurality of printed circuit boards; and an interconnection join layer disposed between adjacent printed circuit boards of the plurality of printed circuit boards so as to physically and electrically couple the adjacent printed circuit boards to each other so as to form an integrated printed circuit board module having a predetermined radio frequency communication characteristic.

B2. The multi-embedded radio frequency board of paragraph B1, wherein the different processing function comprises one or more of radio frequency signal generation, radio frequency transmission, radio frequency reception, heat dissipation, power distribution, radio frequency signal processing (e.g., amplification, conditioning), radio frequency transitions, and radio frequency signal routing.

B3. The multi-embedded radio frequency board of paragraph B2, wherein the another processing function comprises a different one or more of radio frequency signal generation, radio frequency transmission, radio frequency reception, heat dissipation, power distribution, radio frequency signal processing (e.g., amplification, conditioning), radio frequency transitions, and radio frequency signal routing.

B4. The multi-embedded radio frequency board of paragraph B 1, wherein the plurality of printed circuit boards form a stack of printed circuit boards having a first end and a second end, the first end being formed at least in part by a major surface of a first end printed circuit board and the second end being formed at least in part by a major surface of a second end printed circuit board.

B5. The multi-embedded radio frequency board of paragraph B4, wherein at least one of the first end printed circuit board and the second end printed circuit board comprises a radio frequency signal output printed circuit board.

B6. The multi-embedded radio frequency board of paragraph B5, wherein the radio frequency signal output printed circuit board includes an array of antenna horns coupled thereto.

B7. The multi-embedded radio frequency board of paragraph B6, wherein the array of antenna horns have a sub-frequency spacing or a spacing that is a multiple of a frequency wavelength.

B8. The multi-embedded radio frequency board of paragraph B5, wherein the radio frequency signal output printed circuit board comprises a radio frequency connector.

B9. The multi-embedded radio frequency board of paragraph B4, wherein at least one of the first end printed circuit board and the second end printed circuit board comprises a radio frequency signal input printed circuit board.

B10. The multi-embedded radio frequency board of paragraph B9, wherein the radio frequency signal input printed circuit board includes an array of antenna horns coupled thereto.

B11. The multi-embedded radio frequency board of paragraph B10, wherein the array of antenna horns have a sub-frequency spacing or a spacing that is a multiple of a frequency wavelength.

B12. The multi-embedded radio frequency board of paragraph B9, wherein the radio frequency signal input printed circuit board comprises a radio frequency connector.

B13. The multi-embedded radio frequency board of paragraph B4, wherein one of the first end printed circuit board and the second end printed circuit board comprises a radio frequency signal generating printed circuit board that includes at least one integrated circuit configured to generate a radio frequency signal.

B14. The multi-embedded radio frequency board of paragraph B4, wherein one of the first end printed circuit board and the second end printed circuit board comprises a radio frequency signal input printed circuit board that includes at least one integrated circuit configured to receive a radio frequency signal.

B15. The multi-embedded radio frequency board of paragraph B4, wherein at least one intermediate printed circuit board, disposed in the stack of printed circuit boards between the first end printed circuit board and the second end printed circuit board, comprises radio frequency strip lines configured to route radio frequency signals at least between adjacent printed circuit boards.

B16. The multi-embedded radio frequency board of paragraph B4 (or B15), wherein at least one intermediate printed circuit board, disposed in the stack of printed circuit boards between the first end printed circuit board and the second end printed circuit board, comprises power distribution routing to one or more adjacent printed circuit boards.

B17. The radio frequency board module of paragraph B4 (or B15 or B16), wherein at least one intermediate printed circuit board, disposed in the stack of printed circuit boards between the first end printed circuit board and the second end printed circuit board, comprises one or more of an input and output control module embedded within the at least one intermediate printed circuit board.

B18. The multi-embedded radio frequency board of paragraph B4, wherein at least one intermediate printed circuit board, disposed in the stack of printed circuit boards between the first end printed circuit board and the second end printed circuit board, comprises a radio frequency signal processing device embedded within the at least one intermediate printed circuit board.

B19. The multi-embedded radio frequency board of paragraph B18, wherein the radio frequency signal processing device comprises an integrated circuit.

B20. The multi-embedded radio frequency board of paragraph B4 (or B18), wherein at least one intermediate printed circuit board, disposed in the stack of printed circuit boards between the first end printed circuit board and the second end printed circuit board, comprises a capacitor embedded within the at least one intermediate printed circuit board.

B21. The multi-embedded radio frequency board of paragraph B4, wherein at least one of the first end printed circuit board and the second end printed circuit board comprises a radio frequency signal transceiver printed circuit board.

B22. The multi-embedded radio frequency board of paragraph B21, wherein the radio frequency signal transceiver printed circuit board includes an array of antenna horns coupled thereto.

B23. The multi-embedded radio frequency board of paragraph B21, wherein the array of antenna horns have a sub-frequency spacing or a spacing that is a multiple of a frequency wavelength.

B24. The multi-embedded radio frequency board of paragraph B21, wherein the radio frequency signal transceiver printed circuit board comprises a radio frequency connector.

B25. The multi-embedded radio frequency board of paragraph B1, wherein the predetermined radio frequency communication characteristic comprises one or more of radio frequency signal reception and transmission.

B26. The multi-embedded radio frequency board of paragraph B1, wherein the predetermined radio frequency communication characteristic comprises radio frequency lensing.

B27. The multi-embedded radio frequency board of paragraph B1, wherein the predetermined radio frequency communication characteristic comprises radio frequency repetition.

B28. The radio frequency circuit board of paragraph B1, further comprising at least one heat sink coupled to the at least one of the printed circuit boards.

C1. A mobile device including a multi-embedded radio frequency board, comprising:
a frame; and
the multi-embedded radio frequency board being coupled to the frame, the multi-embedded radio frequency board including
a plurality of printed circuit boards stacked one on the other, at least one of the printed circuit boards of the plurality of printed circuit boards being configured so as to have a different processing function than another processing function of another printed circuit board of the plurality of printed circuit boards; and
an interconnection join layer disposed between adjacent printed circuit boards of the plurality of printed circuit boards so as to physically and electrically couple the adjacent printed circuit boards to each other so as to form an integrated printed circuit board module having a predetermined radio frequency communication characteristic.

C2. The mobile device of paragraph C1, wherein the frame forms, at least in part, a handheld communication device.

C3. The mobile device of paragraph C1, wherein the frame forms, at least in part, a spacecraft.

C4. The mobile device of paragraph C1, wherein the frame forms, at least in part, an aircraft.

C5. The mobile device of paragraph C1, wherein the frame forms, at least in part, a terrestrial vehicle.

C6. The mobile device of paragraph C1, wherein the frame forms, at least in part, a maritime vessel.

C7. The mobile device of paragraph C1 (or any one of paragraphs C2-C6), wherein the different processing function comprises one or more of radio frequency signal generation, radio frequency transmission, radio frequency reception, heat dissipation, power distribution, radio frequency signal processing (e.g., amplification, conditioning), radio frequency transitions, and radio frequency signal routing.

C8. The mobile device of paragraph C7, wherein the another processing function comprises a different one or more of radio frequency signal generation, radio frequency transmission, radio frequency reception, heat dissipation, power distribution, radio frequency signal processing (e.g., amplification, conditioning), radio frequency transitions, and radio frequency signal routing.

C9. The mobile device of paragraph C 1 (or any one of paragraphs C2-C6), wherein the plurality of printed circuit boards form a stack of printed circuit boards having a first end and a second end, the first end being formed at least in part by a major surface of a first end printed circuit board and the second end being formed at least in part by a major surface of a second end printed circuit board.

C10. The mobile device of paragraph C9, wherein at least one of the first end printed circuit board and the second end printed circuit board comprises a radio frequency signal output printed circuit board.

C11. The mobile device of paragraph C10, wherein the radio frequency signal output printed circuit board includes an array of antenna horns coupled thereto.

C12. The mobile device of paragraph C11, wherein the array of antenna horns have a sub-frequency spacing or a spacing that is a multiple of a frequency wavelength.

C13. The mobile device of paragraph C10, wherein the radio frequency signal output printed circuit board comprises a radio frequency connector.

C14. The mobile device of paragraph C9, wherein at least one of the first end printed circuit board and the second end printed circuit board comprises a radio frequency signal input printed circuit board.

C15. The mobile device of paragraph C14, wherein the radio frequency signal input printed circuit board includes an array of antenna horns coupled thereto.

C16. The mobile device of paragraph C15, wherein the array of antenna horns have a sub-frequency spacing or a spacing that is a multiple of a frequency wavelength.

C17. The mobile device of paragraph C14, wherein the radio frequency signal input printed circuit board comprises a radio frequency connector.

C18. The mobile device of paragraph C9, wherein one of the first end printed circuit board and the second end printed circuit board comprises a radio frequency signal generating printed circuit board that includes at least one integrated circuit configured to generate a radio frequency signal.

C19. The mobile device of paragraph C18, wherein the one of the first end printed circuit board and the second end printed circuit board comprises a mobile communication device processor printed circuit board.

C20. The mobile device of paragraph C9, wherein one of the first end printed circuit board and the second end printed circuit board comprises a radio frequency signal input printed circuit board that includes at least one integrated circuit configured to receive a radio frequency signal.

C21. The mobile device of paragraph C9, wherein at least one intermediate printed circuit board, disposed in the stack of printed circuit boards between the first end printed circuit board and the second end printed circuit board, comprises radio frequency strip lines configured to route radio frequency signals at least between adjacent printed circuit boards.

C22. The mobile device of paragraph C9 (or C21), wherein at least one intermediate printed circuit board, disposed in the stack of printed circuit boards between the first end printed circuit board and the second end printed circuit board, comprises power distribution routing to one or more adjacent printed circuit boards.

C23. The mobile device of paragraph C9 (or C21 or C22), wherein at least one intermediate printed circuit board, disposed in the stack of printed circuit boards between the first end printed circuit board and the second end printed circuit board, comprises one or more of an input and output control module embedded within the at least one intermediate printed circuit board.

C24. The mobile device of paragraph C9, wherein at least one intermediate printed circuit board, disposed in the stack of printed circuit boards between the first end printed circuit board and the second end printed circuit board, comprises a radio frequency signal processing device embedded within the at least one intermediate printed circuit board.

C25. The mobile device of paragraph C24, wherein the radio frequency signal processing device comprises an integrated circuit.

C26. The mobile device of paragraph C9 (or C24), wherein at least one intermediate printed circuit board, disposed in the stack of printed circuit boards between the first end printed circuit board and the second end printed circuit board, comprises a capacitor embedded within the at least one intermediate printed circuit board.

C27. The mobile device of paragraph C9, wherein at least one of the first end printed circuit board and the second end printed circuit board comprises a radio frequency signal transceiver printed circuit board.

C28. The mobile device of paragraph C27, wherein the radio frequency signal transceiver printed circuit board includes an array of antenna horns coupled thereto.

C29. The mobile device of paragraph C28, wherein the array of antenna horns have a sub-frequency spacing or a spacing that is a multiple of a frequency wavelength.

C30. The mobile device of paragraph C27, wherein the radio frequency signal transceiver printed circuit board comprises a radio frequency connector.

C31. The mobile device of paragraph C 1 (or any one of paragraphs C2-C6), wherein the predetermined radio frequency communication characteristic comprises one or more of radio frequency signal reception and transmission.

C32. The mobile device of paragraph C1 (or any one of paragraphs C2-C6), wherein the predetermined radio frequency communication characteristic comprises radio frequency lensing.

C33. The mobile device of paragraph C1 (or any one of paragraphs C2-C6), wherein the predetermined radio frequency communication characteristic comprises radio frequency repetition.

C34. The mobile device of paragraph C1 (or any one of paragraphs C2-C6), further comprising at least one heat sink coupled to the at least one of the printed circuit boards.

D1. A radio frequency signal repeater comprising:
a first communication printed circuit board;
a second communication printed circuit board;
at least one embedded radio frequency module printed circuit board disposed between and communicably coupled to both the first communication printed circuit board and the second communication printed circuit board; and
wherein
the at least one embedded radio frequency module printed circuit board, the first communication printed circuit board, and the second communication printed circuit board are stacked one board on top of the others, and
adjacent boards of the at least one embedded radio frequency module printed circuit board, the first communication printed circuit board, and the second communication printed circuit board are coupled by a respective interconnection join layer so as to form an integrated printed circuit board module.

D2. The radio frequency signal repeater of paragraph D1, wherein the at least one embedded radio frequency module printed circuit board, the first communication printed circuit board, and the second communication printed circuit board form a stack of printed circuit boards having a first end formed at least in part by a major surface of the first communication printed circuit board and a second end formed at least in part by a major surface of the second communication printed circuit board.

D3. The radio frequency signal repeater of paragraph D1, wherein one of the first communication printed circuit board and the second communication printed circuit board comprises a radio frequency signal output printed circuit board.

D4. The radio frequency signal repeater of paragraph D3, wherein the radio frequency signal output printed circuit board includes an array of antenna horns coupled thereto.

D5. The radio frequency signal repeater of paragraph D4, wherein the array of antenna horns have a sub-frequency spacing or a spacing that is a multiple of a frequency wavelength.

D6. The radio frequency signal repeater of paragraph D3, wherein the radio frequency signal output printed circuit board comprises a radio frequency connector.

D7. The radio frequency signal repeater of paragraph D3 (or any one of D4-D6), wherein another of the first communication printed circuit board and the second communication printed circuit board comprises a radio frequency signal input printed circuit board.

D8. The radio frequency signal repeater of paragraph D7, wherein the radio frequency signal input printed circuit board includes an array of antenna horns coupled thereto.

D9. The radio frequency signal repeater of paragraph D8, wherein the array of antenna horns have a sub-frequency spacing or a spacing that is a multiple of a frequency wavelength.

D10. The radio frequency signal repeater of paragraph D7, wherein the radio frequency signal input printed circuit board comprises a radio frequency connector.

D11. The radio frequency signal repeater of paragraph D1, wherein the at least one of the first communication printed circuit board and the second communication printed circuit board comprises a radio frequency signal transceiver printed circuit board.

D12. The radio frequency signal repeater of paragraph D11, wherein the radio frequency signal transceiver printed circuit board includes an array of antenna horns coupled thereto.

D13. The radio frequency signal repeater of paragraph D12, wherein the array of antenna horns have a sub-frequency spacing or a spacing that is a multiple of a frequency wavelength.

D14. The radio frequency signal repeater of paragraph D11, wherein the radio frequency signal transceiver printed circuit board comprises a radio frequency connector.

D15. The radio frequency signal repeater of paragraph D1, wherein the at least one embedded radio frequency module printed circuit board comprises one or more of an input and output control module embedded within the at least one embedded radio frequency module printed circuit board.

D16. The radio frequency signal repeater of paragraph D1 (or D15), wherein the at least one embedded radio frequency module printed circuit board comprises a radio frequency signal processing device embedded within the at least one intermediate printed circuit board.

D17. The radio frequency signal repeater of paragraph D16, wherein the radio frequency signal processing device comprises an integrated circuit.

D18. The radio frequency signal repeater of paragraph D16, wherein the radio frequency signal processing device comprises a radio frequency signal amplifier.

D19. The radio frequency signal repeater of paragraph D16, wherein the radio frequency signal processing device comprises a radio frequency signal conditioner.

D20. The radio frequency signal repeater of paragraph D1 (or any one of D15 and D16), wherein the at least one embedded radio frequency module printed circuit board comprises radio frequency strip lines configured to route radio frequency signals at least between adjacent printed circuit boards.

D21. The radio frequency signal repeater of paragraph D1 (or any one of D15, D16, and D20), wherein the at least one embedded radio frequency module printed circuit board comprises power distribution routing to one or more adjacent printed circuit boards.

D22. The radio frequency signal repeater of paragraph D1 (or any one of D15, D16, D20, and D21), wherein the at least one embedded radio frequency module printed circuit board comprises at least one direct current filtering device embedded within the at least one intermediate printed circuit board.

D23. The radio frequency signal repeater of paragraph D1, further comprising a heat sink coupled to one or more of the first communication printed circuit board and the second communication printed circuit board communicably.

E1. A radio frequency signal lens comprising:
a first communication printed circuit board;
a second communication printed circuit board;
at least one embedded radio frequency module printed circuit board disposed between and communicably coupled to both the first communication printed circuit board and the second communication printed circuit board; and
wherein
the at least one embedded radio frequency module printed circuit board, the first communication printed circuit board, and the second communication printed circuit board are stacked one board on top of the others, and
adjacent boards of the at least one embedded radio frequency module printed circuit board, the first communication printed circuit board, and the second communication printed circuit board are coupled by a respective interconnection join layer so as to form an integrated printed circuit board module.

E2. The radio frequency signal lens of paragraph E1, wherein the at least one embedded radio frequency module printed circuit board, the first communication printed circuit board, and the second communication printed circuit board form a stack of printed circuit boards having a first end formed at least in part by a major surface of the first communication printed circuit board and a second end formed at least in part by a major surface of the second communication printed circuit board.

E3. The radio frequency signal lens of paragraph E1, wherein one of the first communication printed circuit board and the second communication printed circuit board comprises a radio frequency signal output printed circuit board.

E4. The radio frequency signal lens of paragraph E3, wherein the radio frequency signal output printed circuit board includes an array of antenna horns coupled thereto.

E5. The radio frequency signal lens of paragraph E4, wherein the array of antenna horns have a sub-frequency spacing or a spacing that is a multiple of a frequency wavelength.

E6. The radio frequency signal lens of paragraph E3 (or any one of E4-E5), wherein another of the first communication printed circuit board and the second communication printed circuit board comprises a radio frequency signal input printed circuit board.

E7. The radio frequency signal lens of paragraph E6, wherein the radio frequency signal input printed circuit board includes an array of antenna horns coupled thereto.

E8. The radio frequency signal lens of paragraph E7, wherein the array of antenna horns have a sub-frequency spacing or a spacing that is a multiple of a frequency wavelength.

E9. The radio frequency signal lens of paragraph E1, wherein the at least one of the first communication printed circuit board and the second communication printed circuit board comprises a radio frequency signal transceiver printed circuit board.

E10. The radio frequency signal lens of paragraph E9, wherein the radio frequency signal transceiver printed circuit board includes an array of antenna horns coupled thereto.

E11. The radio frequency signal lens of paragraph E10, wherein the array of antenna horns have a sub-frequency spacing or a spacing that is a multiple of a frequency wavelength.

E12. The radio frequency signal lens of paragraph E1, wherein the at least one embedded radio frequency module printed circuit board comprises one or more of an input and output control module embedded within the at least one embedded radio frequency module printed circuit board.

E13. The radio frequency signal lens of paragraph E1 (or E12), wherein the at least one embedded radio frequency module printed circuit board comprises a radio frequency signal processing device embedded within the at least one intermediate printed circuit board.

E14. The radio frequency signal lens of paragraph E13, wherein the radio frequency signal processing device comprises an integrated circuit.

E15. The radio frequency signal lens of paragraph E13, wherein the radio frequency signal processing device comprises a radio frequency signal amplifier.

E16. The radio frequency signal lens of paragraph E13, wherein the radio frequency signal processing device comprises a radio frequency signal conditioner.

E17. The radio frequency signal lens of paragraph E1 (or any one of E14 and E15), wherein the at least one embedded radio frequency module printed circuit board comprises radio frequency strip lines configured to route radio frequency signals at least between adjacent printed circuit boards.

E18. The radio frequency signal lens of paragraph E1 (or any one of E14, E15, and E19), wherein the at least one embedded radio frequency module printed circuit board comprises power distribution routing to one or more adjacent printed circuit boards.

E19. The radio frequency signal lens of paragraph E1 (or any one of E14, E15, E19, and E20), wherein the at least one embedded radio frequency module printed circuit board comprises at least one direct current filtering device embedded within the at least one intermediate printed circuit board.

E20. The radio frequency signal lens of paragraph E1, further comprising a heat sink coupled to one or more of the first communication printed circuit board and the second communication printed circuit board communicably.

In the figures, referred to above, solid lines, if any, connecting various elements and/or components may represent mechanical, electrical, fluid, optical, electromagnetic, wireless and other couplings and/or combinations thereof. As used herein, "coupled" means associated directly as well as indirectly. For example, a member A may be directly associated with a member B, or may be indirectly associated therewith, e.g., via another member C. It will be understood that not all relationships among the various disclosed elements are necessarily represented. Accordingly, couplings other than those depicted in the drawings may also exist. Dashed lines, if any, connecting blocks designating the various elements and/or components represent couplings similar in function and purpose to those represented by solid lines; however, couplings represented by the dashed lines may either be selectively provided or may relate to alternative examples of the present disclosure. Likewise, elements and/or components, if any, represented with dashed lines, indicate alternative examples of the present disclosure. One or more elements shown in solid and/or dashed lines may be omitted from a particular example without departing from the scope of the present disclosure. Environmental elements, if any, are represented with dotted lines. Virtual (imaginary) elements may also be shown for clarity. Those skilled in the art will appreciate that some of the features illustrated in the figures, may be combined in various ways without the need to include other features described in the figures, other drawing figures, and/or the accompanying disclosure, even though such combination or combinations are not explicitly illustrated herein. Similarly, additional features not limited to the examples presented, may be combined with some or all of the features shown and described herein.

In the foregoing description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

Different examples of the apparatus(es) and method(s) disclosed herein include a variety of components, features, and functionalities. It should be understood that the various examples of the apparatus(es) and method(s) disclosed herein may include any of the components, features, and functionalities of any of the other examples of the apparatus(es) and method(s) disclosed herein in any combination, and all of such possibilities are intended to be within the scope of the present disclosure.

Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims, if any, are presented for illustrative purposes only and are not intended to limit the scope of the claimed subject matter to the specific examples provided in the present disclosure.

What is claimed is:

1. A multi-embedded radio frequency board comprising:
a plurality of printed circuit boards stacked one on the others, at least one of the printed circuit boards of the plurality of printed circuit boards being configured so as to have a different processing function than another processing function of another printed circuit board of the plurality of printed circuit boards; and
an interconnection join layer disposed between adjacent printed circuit boards of the plurality of printed circuit boards, the interconnection join layer physically couples the adjacent printed circuit boards to each other and includes vias that extend through the interconnection join layer to electrically couple the adjacent printed circuit boards to each other so as to form an integrated printed circuit board module having a predetermined radio frequency communication characteristic.

2. The multi-embedded radio frequency board of claim 1, wherein the different processing function comprises one or more of radio frequency signal generation, radio frequency transmission, radio frequency reception, radio frequency signal processing, radio frequency transitions, or radio frequency signal routing.

3. The multi-embedded radio frequency board of claim 2, wherein the another processing function comprises a different one or more of radio frequency signal generation, radio frequency transmission, radio frequency reception, radio frequency signal processing, radio frequency transitions, or radio frequency signal routing.

4. The multi-embedded radio frequency board of claim 1, wherein the plurality of printed circuit boards form a stack of printed circuit boards having a first end and a second end, the first end being formed at least in part by a major surface of a first end printed circuit board and the second end being formed at least in part by a major surface of a second end printed circuit board.

5. The multi-embedded radio frequency board of claim 4, wherein at least one of the first end printed circuit board or the second end printed circuit board comprises a radio frequency signal output printed circuit board.

6. The multi-embedded radio frequency board of claim 4, wherein at least one of the first end printed circuit board or the second end printed circuit board comprises a radio frequency signal input printed circuit board.

7. The multi-embedded radio frequency board of claim 1, wherein the predetermined radio frequency communication characteristic comprises one or more of radio frequency signal reception or transmission.

8. The multi-embedded radio frequency board of claim 1, wherein the predetermined radio frequency communication characteristic comprises radio frequency lensing.

9. The multi-embedded radio frequency board of claim 1, wherein the predetermined radio frequency communication characteristic comprises radio frequency repetition.

10. A multi-embedded radio frequency board comprising:
at least one radio frequency signal generating printed circuit board;
at least one embedded radio frequency module printed circuit board communicably coupled to the at least one radio frequency signal generating printed circuit board; and
at least one communication printed circuit board communicably coupled to one or more of the at least one radio frequency signal generating printed circuit board or the at least one embedded radio frequency module printed circuit board;
wherein
the at least one radio frequency signal generating printed circuit board, the at least one embedded radio frequency module printed circuit board, and the at least one communication printed circuit board are stacked one board on top of the others, and
adjacent boards of the at least one radio frequency signal generating printed circuit board, the at least one embedded radio frequency module printed circuit board, and the at least one communication printed circuit board are coupled by a respective interconnection join layer that physically couples respective ones of the adjacent boards to each other and includes vias that extend through the respective interconnection join layer to electrically couple the respective ones of the adjacent boards to each other so as to form an integrated printed circuit board module.

11. The multi-embedded radio frequency board of claim 10, wherein the at least one radio frequency signal generating printed circuit board, the at least one embedded radio frequency module printed circuit board, and the at least one communication printed circuit board form a stack of printed circuit boards having a first end formed at least in part by a major surface of the at least one radio frequency signal generating printed circuit board and a second end formed at least in part by a major surface of the at least one communication printed circuit board.

12. The multi-embedded radio frequency board of claim 10, wherein the integrated printed circuit board module is configured as a radio frequency signal receiver.

13. The multi-embedded radio frequency board of claim 10, wherein the integrated printed circuit board module is configured as a radio frequency signal transmitter.

14. The multi-embedded radio frequency board of claim 10, wherein the integrated printed circuit board module is configured as a radio frequency signal transceiver.

15. The multi-embedded radio frequency board of claim 10, wherein the at least one embedded radio frequency module printed circuit board is disposed between the at least one radio frequency signal generating printed circuit board and the at least one communication printed circuit board, wherein the at least one embedded radio frequency module printed circuit board comprises one or more of an input control module and an output control module embedded within the at least one embedded radio frequency module printed circuit board.

16. A mobile device including a multi-embedded radio frequency board, comprising:
   a frame; and
   the multi-embedded radio frequency board being coupled to the frame, the multi-embedded radio frequency board including
      a plurality of printed circuit boards stacked one on the other, at least one of the printed circuit boards of the plurality of printed circuit boards being configured so as to have a different processing function than another processing function of another printed circuit board of the plurality of printed circuit boards; and
      an interconnection join layer disposed between adjacent printed circuit boards of the plurality of printed circuit boards that physically couples the adjacent printed circuit boards to each other and includes vias that extend through the interconnection join layer to electrically couple the adjacent printed circuit boards to each other so as to form an integrated printed circuit board module having a predetermined radio frequency communication characteristic.

17. The mobile device of claim 16, wherein the frame forms, at least in part, a handheld communication device.

18. The mobile device of claim 16, wherein the frame forms, at least in part, a spacecraft.

19. The mobile device of claim 16, wherein the different processing function comprises one or more of radio frequency signal generation, radio frequency transmission, radio frequency reception, radio frequency signal processing, radio frequency transitions, or radio frequency signal routing.

20. The mobile device of claim 19, wherein the another processing function comprises a different one or more of radio frequency signal generation, radio frequency transmission, radio frequency reception, radio frequency signal processing, radio frequency transitions, or radio frequency signal routing.

21. The multi-embedded radio frequency board of claim 2, wherein the different processing function further comprises one or more of heat dissipation or power distribution.

22. The multi-embedded radio frequency board of claim 3, wherein the another processing function further comprises a different one or more of heat dissipation or power distribution.

23. The mobile device of claim 19, wherein the different processing function further comprises one or more of heat dissipation or power distribution.

24. The mobile device of claim 20, wherein the another processing function further comprises a different one or more of heat dissipation or power distribution.

* * * * *